(12) United States Patent
Oshita et al.

(10) Patent No.: US 10,075,160 B2
(45) Date of Patent: Sep. 11, 2018

(54) SWITCH CIRCUIT, RADIO-FREQUENCY MODULE, AND COMMUNICATION DEVICE

(71) Applicant: Murata Manufacturing Co., Ltd., Nagaokakyo-shi, Kyoto-fu (JP)

(72) Inventors: Teruaki Oshita, Nagaokakyo (JP); Daisuke Miyazaki, Nagaokakyo (JP); Morio Takeuchi, Nagaokakyo (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 15/672,480

(22) Filed: Aug. 9, 2017

(65) Prior Publication Data

US 2018/0048308 A1 Feb. 15, 2018

(30) Foreign Application Priority Data

Aug. 10, 2016 (JP) .................. 2016-158060
Dec. 27, 2016 (JP) .................. 2016-254538
May 25, 2017 (JP) .................. 2017-103468

(51) Int. Cl.
| | |
|---|---|
| H04B 1/40 | (2015.01) |
| H04B 1/66 | (2006.01) |
| H03K 17/693 | (2006.01) |
| H03K 17/16 | (2006.01) |
| H03K 17/687 | (2006.01) |

(52) U.S. Cl.
CPC ......... *H03K 17/693* (2013.01); *H03K 17/162* (2013.01); *H03K 17/6874* (2013.01); *H03K 17/6877* (2013.01)

(58) Field of Classification Search
CPC .............. H03K 17/693; H03K 17/162; H03K 17/6874; H03K 17/6877; H04B 1/40; H04B 1/66; H04B 1/3822
USPC ............................................................. 326/7
See application file for complete search history.

(56) References Cited

U.S. PATENT DOCUMENTS 8,954,025 B2 * 2/2015 Vogas .................. H03H 9/0542
 455/304
2011/0116490 A1 * 5/2011 Wilhelmsson ........ H04W 16/14
 370/343

FOREIGN PATENT DOCUMENTS

JP 2015-115866 A 6/2015

* cited by examiner

*Primary Examiner* — Daniel D Chang
(74) *Attorney, Agent, or Firm* — Keating & Bennett, LLP

(57) ABSTRACT

A switch circuit includes first and second switches. The first switch includes a first common terminal and at least two first selection terminals selectively connected to the first common terminal. The second switch includes at least one second common terminal and at least one second selection terminal selectively connected to the at least one second common terminal. One of the at least two first selection terminals and the at least one second common terminal are connected to each other via a path passing through a first multiplexer. Another one of the at least two first selection terminals and the at least one second common terminal are connected to each other via a bypass path bypassing the first multiplexer.

19 Claims, 18 Drawing Sheets

SWITCH CIRCUIT, RADIO-FREQUENCY MODULE, AND COMMUNICATION DEVICE

CROSS REFERENCE TO RELATED APPLICATIONS

This application claims the benefit of priority to Japanese Patent Application No. 2017-103468 filed on May 25, 2017, Japanese Patent Application No. 2016-254538 filed on Dec. 27, 2016 and Japanese Patent Application No. 2016-158060 filed on Aug. 10, 2016. The entire contents of these applications are hereby incorporated herein by reference.

BACKGROUND OF THE INVENTION

1. Field of the Invention

The present invention relates to a switch circuit, a radio-frequency module, and a communication device.

2. Description of the Related Art

Lately, there has been an increasing demand for supporting a carrier aggregation (CA) for simultaneously sending and receiving multiple signals of different frequency bands. Japanese Unexamined Patent Application Publication No. 2015-115866 discloses a circuit using a quadplexer such as that shown in FIG. 18. FIG. 18 is a schematic diagram illustrating an example of a known CA-support circuit 400.

The known CA-support circuit 400 simultaneously sends and receives multiple signals of different frequency bands by using a quadplexer (multiplexer) 420 connected to an antenna 410.

When a signal passes through a multiplexer, insertion loss occurs because of this multiplexer. For example, in the known CA-support circuit 400 shown in FIG. 18, even when a signal is sent or received in a non-CA mode, it passes through the quadplexer (multiplexer) 420, thus causing insertion loss.

SUMMARY OF THE INVENTION

Accordingly, preferred embodiments of the present invention provide switch circuits, radio-frequency modules, and communication devices that are able to support CA communication and also to reduce insertion loss caused by a multiplexer when CA communication is not performed.

According to a preferred embodiment of the present invention, a switch circuit includes first and second switches. The first switch includes a first common terminal and at least two first selection terminals selectively connected to the first common terminal. The second switch includes at least one second common terminal and at least one second selection terminal selectively connected to the at least one second common terminal. One of the at least two first selection terminals and the at least one second common terminal are connected to each other via a path passing through a first multiplexer. The first multiplexer is a filter which separates one signal into multiple signals of different frequency bands or integrates multiple signals of different frequency bands into one signal. Another one of the at least two first selection terminals and the at least one second common terminal are connected to each other via a bypass path bypassing the first multiplexer.

With the above-described configuration, the first and second switches are connected to each other via at least two paths, that is, the path passing through the first multiplexer and the bypass path bypassing the first multiplexer. Connecting the first common terminal and a certain first selection terminal allows RF signals to pass through the first multiplexer, thus achieving CA communication. When CA communication is not performed, the first common terminal and another certain first selection terminal are connected to each other so as to allow RF signals to transmit between the first and second switches without passing through the first multiplexer. As a result, the switch circuit of the present preferred embodiment is able to support CA communication and also to reduce insertion loss caused by the multiplexer when CA communication is not performed.

The at least one second selection terminal may include a second selection terminal connected to a terminating resistor.

A high power signal received by an antenna may leak to the second switch even when the first common terminal and the at least two first selection terminals are not connected to each other. To address this issue, in the present preferred embodiment, a terminating resistor is connected to one of the at least one second selection terminal. By connecting the second common terminal and the second selection terminal to which the terminating resistor is connected, the terminating resistor is able to output energy of a high power signal received by the antenna to a ground. It is thus less likely that a circuit, such as a filter or a low-noise amplifier (LNA), connected to the second switch will be broken or the performance will be decreased by a high power signal.

A matching circuit may be disposed between the at least two first selection terminals and the at least one second common terminal.

The matching circuit performs impedance matching between the first and second switches, thus decreasing the level of loss (return loss) which may occur in an RF signal transmitted between the first and second switches.

The second switch may include at least two second common terminals as the at least one second common terminal. The first selection terminal connected to the path passing through the first multiplexer and one of the at least two second common terminals may be connected to each other via the path passing through the first multiplexer. The first selection terminal connected to the bypass path bypassing the first multiplexer and another one of the at least two second common terminals may be connected to each other via the bypass path.

The path passing through the first multiplexer and the bypass path bypassing the first multiplexer are connected to different second common terminals of the at least two second common terminals. Accordingly, the path passing through the first multiplexer and the bypass path bypassing the first multiplexer do not join together, thus making it possible to reduce insertion loss caused by the multiplexer when CA communication is not performed while enhancing the isolation between these paths.

A path passing through a filter and a bypass path bypassing the filter may be connected to the at least one second selection terminal. The path passing through the filter and the bypass path bypassing the filter may be connected to different second selection terminals of the at least one second selection terminal.

At least two paths, that is, the path passing through the filter and the bypass path bypassing the filter, are connected to the second switch. By connecting one of the at least two second common terminals and one certain second selection terminal with each other, an RF signal transmitted through the path connected to the second selection terminal passes through the filter, thus making it possible to filter this RF signal by using the filter. When filtering of this RF signal is not necessary, one of the at least two second common terminals and another certain second selection terminal are connected to each other, so that the RF signal is able to be transmitted to the path connected to this second selection terminal without passing through the filter. As a result, when filtering of an RF signal is not necessary, insertion loss caused by the filter is able to be reduced.

A path passing through an amplifier circuit and a bypass path bypassing the amplifier circuit may directly or indirectly be connected to the at least one second selection terminal. The path passing through the amplifier circuit and the bypass path bypassing the amplifier circuit may be connected to different second selection terminals of the at least one second selection terminal.

At least two paths, that is, the path passing through the amplifier circuit and the bypass path bypassing the amplifier circuit, are directly or indirectly connected to the second switch. When the path passing through the amplifier circuit and the bypass path bypassing the amplifier circuit are directly connected to the second switch, one of the at least two second common terminals and one certain second selection terminal are connected to each other. This allows an RF signal transmitted through the path connected to this second selection terminal to pass through the amplifier circuit, thus making it possible to amplify this RF signal. When amplifying of this RF signal is not necessary, one of the at least two second common terminals and another certain second selection terminal are connected to each other, so that the RF signal is able to be transmitted to the bypass path connected to this second selection terminal without passing through the amplifier circuit. When the path passing through the amplifier circuit and the bypass path bypassing the amplifier circuit are indirectly (via a different switch, for example) connected to the second switch, one certain selection terminal of the different switch and one of common terminals of this switch are connected to each other. This allows an RF signal transmitted through the path connected to this selection terminal to pass through the amplifier circuit, thus making it possible to amplify this RF signal. When amplifying of this RF signal is not necessary, another certain selection terminal of the different switch and another one of the common terminals are connected to each other, so that the RF signal is able to be transmitted to the bypass path connected to this selection terminal without passing through the amplifier circuit. As a result, when amplifying of an RF signal is not necessary, power is not consumed by the amplifier circuit.

A branching path that branches into a path passing through an amplifier circuit and a bypass path bypassing the amplifier circuit may directly or indirectly be connected to the at least one second selection terminal. A bypass switch may be disposed on the bypass path bypassing the amplifier circuit to selectively pass or block a signal flowing through the bypass path.

The above-described branching path is directly or indirectly connected to the second switch. When the branching path is directly connected to the second switch, by turning OFF the bypass switch (single-pole single-throw (SPST) switch) disposed on the bypass path, an RF signal transmitted to the path connected to the at least one second selection terminal passes through the amplifier circuit, thus making it possible to amplify the RF signal in the amplifier circuit. When amplifying of this RF signal is not necessary, the bypass switch is turned ON, thus allowing the RF signal to be transmitted to the path connected to the at least one second selection terminal without passing through the amplifier circuit. When the branching path is indirectly (via a different switch, for example) connected to the second switch, by turning OFF the bypass switch, an RF signal transmitted to the path connected to this different switch passes through the amplifier circuit, thus making it possible to amplify the RF signal in the amplifier circuit. When amplifying of this RF signal is not necessary, the bypass switch is turned ON, thus allowing the RF signal to be transmitted to the path connected to the different switch without passing through the amplifier circuit. As a result, when amplifying of an RF signal is not necessary, power is not consumed by the amplifier circuit.

The switch circuit may further include a third switch including at least two third selection terminals and at least one third common terminal selectively connected to the at least two third selection terminals. A branching path that branches into a path passing through an amplifier circuit and a bypass path bypassing the amplifier circuit may be connected to the first multiplexer. The path passing through the amplifier circuit may be connected to one of the at least two third selection terminals. The bypass path bypassing the amplifier circuit may be connected to another one of the at least two third selection terminals. A bypass switch may be disposed on the bypass path bypassing the amplifier circuit to selectively pass or block a signal flowing through the bypass path.

The first multiplexer and the third switch are connected to each other by at least two paths, that is, the path passing through the amplifier circuit and the bypass path bypassing the amplifier circuit. By turning OFF the bypass switch disposed on the bypass path, an RF signal transmitted between the first multiplexer and the third switch passes through the amplifier circuit, thus making it possible to amplify the RF signal in the amplifier circuit. When amplifying of this RF signal is not necessary, the bypass switch is turned ON, thus allowing the RF signal to be transmitted between the first multiplexer and the third switch without passing through the amplifier circuit. As a result, when amplifying of an RF signal is not necessary, power is not consumed by the amplifier circuit.

A matching circuit may be disposed before a branching point of the branching path.

Providing a switch and an amplifier circuit into one chip (semiconductor chip) reduces the size of a module on which the switch and the amplifier circuit are mounted. It may be necessary to adjust impedance matching between the amplifier circuit and a component connected to the amplifier circuit according to the environments where the module is used. Consequently, the matching circuit that performs such impedance matching is not usually provided in the same chip as that of the switch and the amplifier circuit. In the above-described preferred embodiment, the matching circuit is disposed before the branching point of the branching path. Thus, it is not necessary to provide terminals that connect the matching circuit to a chip other than the terminals that input and output RF signals, thus reducing the size of the chip.

A matching circuit may be disposed between a branching point of the branching path and the amplifier circuit.

If a matching circuit, which performs impedance matching between the amplifier circuit and a component connected to the amplifier circuit, is disposed before the branching point of the branching path, an RF signal which will pass through the bypass path bypassing the amplifier circuit passes through the matching circuit. In this case, the frequency band of this RF signal may deviate from a desirable band as a result of passing through the matching circuit. In the above-described preferred embodiment, the matching circuit is disposed between the branching point of the branching path and the amplifier circuit. Thus, an RF signal which passes through the path passing through the amplifier circuit passes through the matching circuit and is thus subjected to impedance matching by the matching circuit. An RF signal which passes through the bypass path bypassing the amplifier circuit does not pass through the matching circuit and is not subjected to impedance matching.

The first switch may include at least three first selection terminals as the at least two first selection terminals. Among the at least three first selection terminals, a first selection terminal other than the first selection terminal connected to the path passing through the first multiplexer and the first selection terminal connected to the bypass path bypassing the first multiplexer may be a sending first selection terminal.

When the first common terminal of the first switch is connected to the first selection terminal connected to the path passing through the first multiplexer or the first selection terminal connected to the bypass path bypassing the first multiplexer, the antenna is able to be used as a receive antenna. When the first common terminal is connected to the sending first selection terminal, the antenna is able to be used as a transmit antenna. Thus, the antenna is able to be used as a transmit-and-receive antenna, thus reducing the size of a communication device, such as a cellular phone.

The switch circuit may include two or more second switches as the second switch. The first common terminal may be connected to an antenna. The at least two first selection terminals may be each connected to a first signal path. The two or more second switches may be disposed in the first signal path and may each include one second common terminal as the at least one second common terminal. The first selection terminal connected to the path passing through the first multiplexer may be connected to the second common terminal via the path passing through the first multiplexer. The first selection terminal connected to the bypass path bypassing the first multiplexer may be connected to the second common terminal via the bypass path. A fourth switch may be disposed between the first multiplexer and the second common terminal. A signal received by the antenna may be transmitted to the first signal path via the first multiplexer when the first common terminal and the first selection terminal connected to the path passing through the first multiplexer are connected to each other and when the fourth switch is ON. A signal received by the antenna may be transmitted to the first signal path without passing through the first multiplexer when the first common terminal and the first selection terminal connected to the bypass path bypassing the first multiplexer are connected to each other and when the fourth switch is OFF.

By connecting the first common terminal and the first selection terminal connected to the bypass path bypassing the first multiplexer to each other and by turning OFF the fourth switch, a signal received by the antenna is able to be transmitted to the first signal path without passing through the first multiplexer. When CA communication is performed, the first common terminal and the first selection terminal connected to the path passing through the first multiplexer are connected to each other, and the fourth switch 60 is turned ON. In contrast, when CA communication is not performed, the first common terminal and the first selection terminal connected to the bypass path bypassing the first multiplexer are connected to each other, and the fourth switch is turned OFF. It is thus possible to support CA communication and also to reduce insertion loss caused by the first multiplexer when CA communication is not performed.

The first switch may include at least three first selection terminals as the at least two first selection terminals. Among the at least three first selection terminals, at least one first selection terminal other than the first selection terminal connected to the path passing through the first multiplexer and the first selection terminal connected to the bypass path bypassing the first multiplexer may be at least one sending first selection terminal. The at least one sending first selection terminal may be connected to a second signal path, which is a path different from the first signal path. A signal to be sent from the antenna may be transmitted to the second signal path when the first common terminal and the at least one sending first selection terminal are connected to each other.

When the first common terminal is connected to the first selection terminal connected to the path passing through the first multiplexer or the first selection terminal connected to the bypass path bypassing the first multiplexer, the single antenna is able to be used as a receive antenna, thus enabling the switch circuit to receive signals of different frequency bands received by the antenna. When the first common terminal is connected to the sending first selection terminal, a sending signal transmitted to the second signal path is able to be sent to the single antenna, and the antenna can also be used as a transmit antenna. By using the switch circuit that is able to receive signals of different frequency bands, the single antenna may be used as a transmit-and-receive antenna, thus reducing the size of a communication device, such as a cellular phone.

The switch circuit may further include a fifth switch. The fifth switch is disposed in the second signal path and includes a fifth common terminal connected to the at least one sending first selection terminal and includes at least two fifth selection terminals.

The fifth switch makes it possible to simultaneously send multiple sending signals of different frequency bands.

A matching circuit may be disposed between the at least one sending first selection terminal and the fifth common terminal.

The matching circuit performs impedance matching between the first switch and the fifth switch, thus decreasing the level of loss (return loss) which may occur in a signal transmitted to the second signal path.

The switch circuit may include two or more fifth switches as the fifth switch. A second multiplexer may be connected between one of the at least one sending first selection terminal and the fifth common terminal of each of the two or more fifth switches.

This makes it possible to simultaneously send multiple sending signals of different frequency bands, thus achieving CA communication for sending signals.

The first switch may include at least two sending first selection terminals as the at least one sending first selection terminal. A sixth switch may be connected between the second multiplexer and the fifth common terminal. A signal to be sent from the antenna may be transmitted to the second signal path without passing through the second multiplexer when the first common terminal and another one of the at least two sending first selection terminals are connected to each other and when the sixth switch is OFF.

By connecting the first common terminal and another one of the at least two sending first selection terminals to each other and by turning OFF the sixth switch, a signal transmitted to the second signal path can be sent to the antenna without passing through the second multiplexer. As a result, when CA communication is not performed, insertion loss caused by the multiplexer is able to be reduced.

According to another preferred embodiment of the present invention, a radio-frequency module includes the above-described switch circuit, a filter connected to the at least one second selection terminal, and an amplifier circuit connected to the filter.

It is thus possible to provide a radio-frequency module that is able to support CA communication and also to reduce insertion loss caused by a multiplexer when CA communication is not performed.

According to another preferred embodiment of the present invention, a communication device includes a radio-frequency signal processing circuit and the above-described radio-frequency module. The radio-frequency signal processing circuit processes a radio-frequency signal sent or received by an antenna. The above-described radio-frequency module transmits the radio-frequency signal between the antenna and the radio-frequency signal processing circuit.

It is thus possible to provide a communication device that is able to support CA communication and also to reduce insertion loss caused by a multiplexer when CA communication is not performed.

According to preferred embodiments of the present invention, it is possible to provide switch circuits, radio-frequency modules, and communication devices that are able to support CA communication and also to reduce insertion loss caused by a multiplexer when CA communication is not performed.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
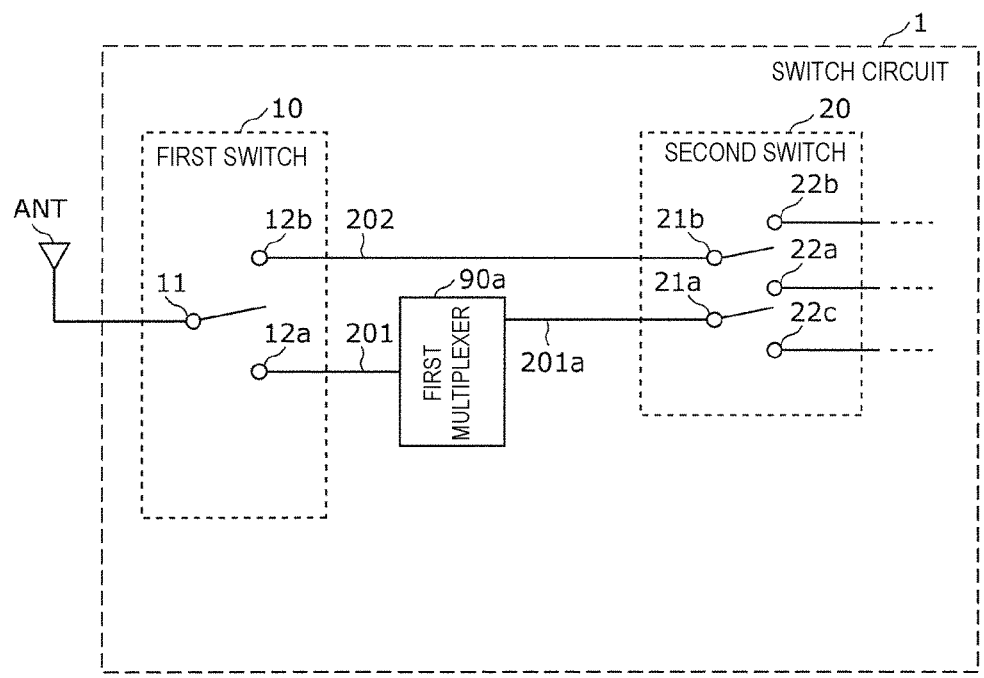
FIG. 1 is a schematic diagram illustrating an example of a switch circuit according to a first preferred embodiment of the present invention.

Preferred embodiments of the present invention will be described below in detail with reference to the accompanying drawings. All of the preferred embodiments described below illustrate general or specific examples. Numeric values, components, and positions and connection states of the components illustrated in the following preferred embodiments are only examples, and are not described for limiting the present invention. Among the components illustrated in the following preferred embodiments, the components that are not recited in the independent claims which embody the broadest concept of various preferred embodiments of the present invention will be described as optional components. The drawings are only schematic drawings and do not necessarily illustrate the components precisely. In the drawings, the same components are designated by like reference numerals.

First Preferred Embodiment

A switch circuit 1 according to a first preferred embodiment of the present invention will be described below with reference to FIG. 1.

FIG. 1 is a schematic diagram illustrating an example of the switch circuit 1 according to the first preferred embodiment. In FIG. 1, in addition to the switch circuit 1, an antenna ANT is shown.

The antenna ANT is a multiband-support antenna which sends and receives radio-frequency (RF) signals in compliance with a communication standard, such as Long Term Evolution (LTE). The antenna ANT may be a main antenna. The antenna ANT may alternatively be a sub antenna (diversity antenna) separately provided from a main antenna to improve the quality and the reliability of communication.

The switch circuit 1 supports carrier aggregation (CA) in which at least two different frequency bands are simultaneously used. The switch circuit 1 is disposed in a front-end portion of a communication device, such as a cellular phone, for example. In the first preferred embodiment, the switch circuit 1 is connected to the antenna ANT.

The switch circuit 1 includes a first switch 10, a second switch 20, and a first multiplexer 90a. The switch circuit 1 may not necessarily include the first multiplexer 90a. That is, the switch circuit 1 and the first multiplexer 90a may separately be provided. For example, a radio-frequency module includes the switch circuit 1 and the first multiplexer 90a separately.

The first switch 10 includes a first common terminal 11 and at least two first selection terminals 12 selectively connected to the first common terminal 11. In the first preferred embodiment, the first switch 10 includes two first selection terminals 12a and 12b. The first switch 10 may include three or more first selection terminals.

One of the first selection terminals 12a and 12b is selectively connected to the first common terminal 11 in accordance with a control signal output from a controller (not shown) included in the first switch 10 or in a radio-frequency module including the first switch 10 or from an RF signal processing circuit (radio frequency integrated circuit (RFIC)). The first switch 10 is a field-effect transistor (FET) switch made of a gallium arsenide (GaAs) or a complementary metal oxide semiconductor (CMOS) or a diode switch, for example. Likewise, in each of the switches described below, one of the selection terminals is selectively connected to the common terminal in accordance with a control signal output from a controller included in the corresponding switch or in a radio-frequency module including the switch or from an RF signal processing circuit. These switches are also FET switches made of GaAs or CMOS or diode switches, for example.

The second switch 20 includes at least one second common terminal and at least one second selection terminal selectively connected to the at least one second common terminal. In the first preferred embodiment, the second switch 20 includes at least two second common terminals (more specifically, two second common terminals 21a and 21b) and three second selection terminals 22a through 22c. The second switch 20 may include three or more second common terminals and one, two, or four or more second selection terminals.

One of the at least two first selection terminals of the first switch 10 and one of the at least two second common terminals of the second switch 20 are connected to each other via a path passing through the first multiplexer 90a. In FIG. 1, the first selection terminal 12a and the second common terminal 21a are connected to each other via paths 201 and 201a passing through the first multiplexer 90a.

Another one of the at least two first selection terminals of the first switch 10 and another one of the at least two second common terminals of the second switch 20 are connected to each other via a bypass path 202 bypassing the first multiplexer 90a. In FIG. 1, the first selection terminal 12b and the second common terminal 21b are connected to each other via the bypass path 202.

The multiplexer includes filters which separate one signal into multiple signals of different frequency bands or integrate multiple signals of different frequency bands into one signal. The multiplexer includes plural filters. A terminal at one end of each filter is connected to a terminal at the same end of another filter, thus integrating the plural filters into each other. That is, the multiplexer is a duplexer, a triplexer, or a quadplexer.

The first multiplexer 90a enables the switch circuit 1 to simultaneously handle multiple RF signals of different frequency bands, such as a low middle band (LMB), a middle band (MB), a middle high band (MHB), and a high band (HB), sent and received by the antenna ANT. The switch circuit 1 can thus perform CA communication. The LMB is about 1475 MHz to about 2020 MHz, for example. The MB is about 2110 MHz to about 2200 MHz, for example. The MHB is about 2300 MHz to about 2400 MHz, for example. The HB is about 2300 MHz to about 2700 MHz, for example. The frequency bands of RF signals that are able to be simultaneously used by the first multiplexer 90a are not restricted to the LMB, MB, MHB, and HB. The above-described values of the LMB, MB, MHB, and HB are also only examples. In FIG. 1, the path 201a which is connected to one of the terminals at the other ends of the filters in the first multiplexer 90a is only shown, and paths which are connected to the other terminals at the other ends of the filters are not shown.

Each of the filters of the first multiplexer 90a may be an elastic wave resonator, an LC circuit, or both of them. The elastic wave resonator may be a surface acoustic wave (SAW) resonator or a bulk acoustic wave (BAW) resonator. The SAW resonator includes a substrate and interdigital transducer (IDT) electrodes. The substrate preferably has piezoelectricity at least on its surface. For example, the substrate may have a piezoelectric thin film on its surface, and may be a multilayer body of this piezoelectric thin film and another film having different acoustic velocities, and a support substrate. Alternatively, the entirety of the substrate may have piezoelectricity. In this case, the substrate is a piezoelectric substrate defined by a single piezoelectric layer.

The filters of the first multiplexer 90a may be band pass filters. Other examples of the filters are a high pass filter, a low pass filter, and a band elimination filter.

Figure 18:
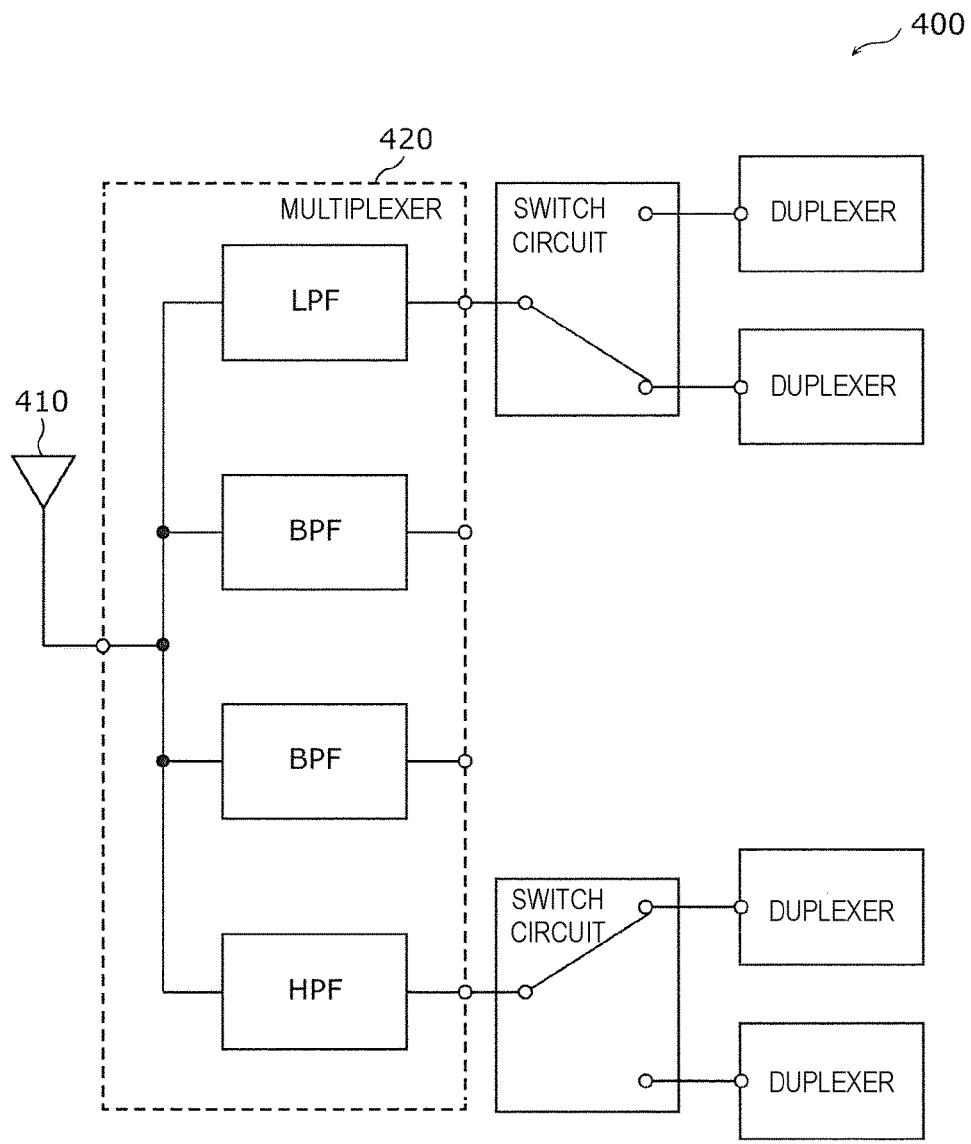
FIG. 18 is a schematic diagram illustrating an example of a known CA-support circuit.

When an RF signal passes through a multiplexer, insertion loss occurs because of this multiplexer. In the CA-support circuit 400 shown in FIG. 18, for example, signals received by the antenna 410 pass through the multiplexer 420. Even when one signal is sent or received without performing CA communication (non-CA mode), it passes through the multiplexer 420, thus causing insertion loss.

In contrast, in the first preferred embodiment, at least two paths are provided to connect the first switch 10 and the second switch 20. One path is a combination of the paths 201 and 201a passing through the first multiplexer 90a, and the other path is the bypass path 202 bypassing the first multiplexer 90a. This will be discussed more specifically. When the first common terminal 11 and the first selection terminal 12a are connected, RF signals received by the antenna ANT and those to be sent by the antenna ANT are transmitted to the paths 201 and 201a passing through the first multiplexer 90a. When the first common terminal 11 and the first selection terminal 12b are connected, RF signals received by the antenna ANT and those to be sent by the antenna ANT are transmitted to the bypass path 202 without passing through the first multiplexer 90a. Connecting the first common terminal 11 and the first selection terminal 12a allows RF signals to pass through the first multiplexer 90a, thus achieving CA communication. When CA communication is not performed, the first common terminal 11 and the first selection terminal 12b are connected so as to allow RF signals to transmit between the first and second switches 10 and 20 without passing through the first multiplexer 90a. As a result, the switch circuit 1 of the first preferred embodiment is able to support CA communication and also to reduce insertion loss caused by the multiplexer when CA communication is not performed.

The path passing through the first multiplexer 90a and the bypass path 202 bypassing the first multiplexer 90a are connected to the different second common terminals 21a and 21b. Accordingly, the path (path 201a) passing through the first multiplexer 90a and the bypass path 202 bypassing the first multiplexer 90a do not join together, thus making it possible to reduce insertion loss caused by the multiplexer when CA communication is not performed while enhancing the isolation between these paths.

Second Preferred Embodiment

A radio-frequency module 2a according to a second preferred embodiment of the present invention will be described below with reference to FIG. 2.

Figure 2:
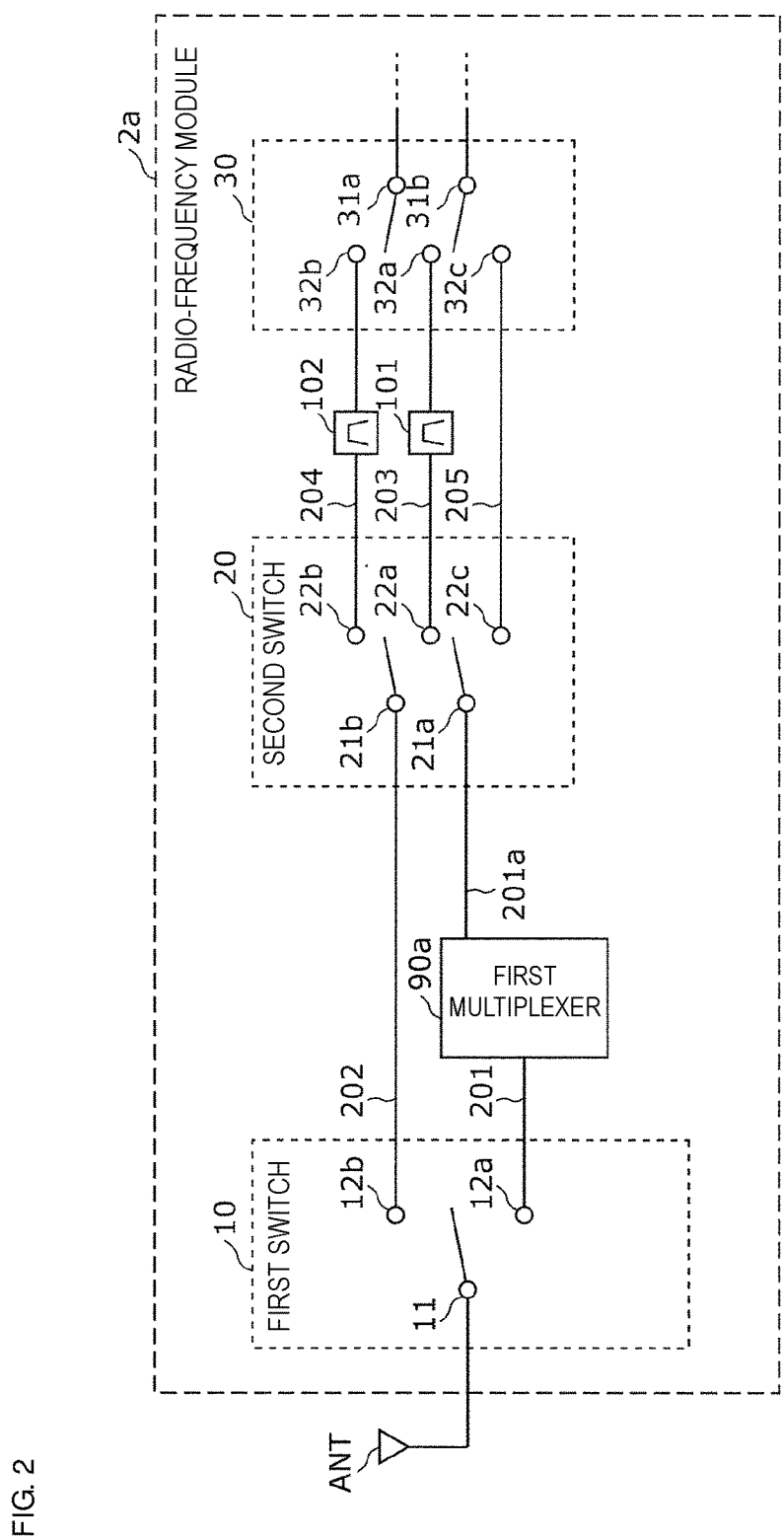
FIG. 2 is a schematic diagram illustrating an example of a radio-frequency module according to a second preferred embodiment of the present invention.

FIG. 2 is a schematic diagram illustrating an example of the radio-frequency module 2a according to the second preferred embodiment. In FIG. 2, in addition to the radio-frequency module 2a, an antenna ANT is shown. In the schematic diagrams illustrating other radio-frequency modules, which will be described below, an antenna ANT is shown in addition to the radio-frequency modules. The radio-frequency module 2a includes a switch circuit and filters.

The radio-frequency module 2a supports CA communication in which at least two different frequency bands are simultaneously used. The radio-frequency module 2a is disposed in a front-end portion of a communication device, such as a cellular phone, for example. In the second preferred embodiment, the radio-frequency module 2a is connected to the antenna ANT. Other radio-frequency modules, which will be described below, also support CA communication in which at least two different frequency bands are simultaneously used, and are connected to the antenna ANT.

The switch circuit according to the second preferred embodiment includes a switch 30 in addition to the elements of the switch circuit 1 of the first preferred embodiment.

The switch 30 includes at least two selection terminals and at least one common terminal selectively connected to the at least two selection terminals. In the second preferred embodiment, the switch 30 includes three selection terminals 32a through 32c and at least two common terminals (more specifically, two common terminals 31a and 31b). The switch 30 may include one or three or more common terminals and two or four or more selection terminals.

A path passing through a filter and a bypass path bypassing the filter are connected to at least one second selection terminal (at least two second selection terminals in the second preferred embodiment) of the second switch 20. The path passing through a filter and the bypass path bypassing the filter are connected to different second selection terminals.

More specifically, one of the at least two second selection terminals of the second switch 20 and one of the at least two selection terminals of the switch 30 are connected to each other via a path passing through a filter. Plural second selection terminals of the second switch 20 and the associating plural selection terminals of the switch 30 may be connected to each other via paths passing through filters. In FIG. 2, the second selection terminal 22a of the second switch 20 and the selection terminal 32a of the switch 30 are connected to each other via a path 203 passing through a filter 101. The second selection terminal 22b of the second switch 20 and the selection terminal 32b of the switch 30 are connected to each other via a path 204 passing through a filter 102.

Another one of the at least two second selection terminals of the second switch 20 and another one of the at least two selection terminals of the switch 30 are connected to each other via a bypass path 205 bypassing the filters 101 and 102. In FIG. 2, the second selection terminal 22c of the second switch 20 and the selection terminal 32c of the switch 30 are connected to each other via the bypass path 205.

Each of the filters 101 and 102 is a band pass filter which allows signals of a predetermined frequency band to pass therethrough. The filters 101 and 102 each include a SAW resonator, a BAW resonator, or a film bulk acoustic resonator (FBAR). A SAW filter may include IDT electrodes on a piezoelectric substrate. Accordingly, if the filters 101 and 102 are SAW filters including SAW resonators, they can be small and thin and also exhibit sharp bandpass characteristics. The filters 101 and 102 may alternatively be LC resonance circuits including circuit elements, such as inductors and capacitors.

The piezoelectric substrate preferably has piezoelectricity at least on its surface. For example, the piezoelectric substrate may include a piezoelectric thin film on its surface, and may be a multilayer body including the piezoelectric thin film and another film having different acoustic velocities, and a support substrate. Alternatively, the entirety of the piezoelectric substrate may have piezoelectricity. In this case, the piezoelectric substrate includes a single piezoelectric layer.

An RF signal received by the second common terminal 21a or 21b is filtered as a result of passing through the filter 101 or 102. For example, an RF signal is filtered and narrowed down to a wider band (HB, for example) by the first multiplexer 90a and is received by the second common terminal 21a. The RF signal is able to be filtered and narrowed down to a narrower band again by the filter 101 or 102. When CA communication is not performed, an RF signal that does not pass through the first multiplexer 90a is able to be filtered by using the filter 101 or 102. However, when an RF signal passes through a filter, insertion loss occurs because of the filter.

To address this issue, in the second preferred embodiment, at least two paths, that is, the path (path 203 or 204) passing through the filter (filter 101 or 102) and the bypass path 205 bypassing the filters, are connected to the second switch 20. By connecting one of the at least two second common terminals and the second selection terminal 22a or 22b with each other, an RF signal transmitted through the path 203 or 204 connected to the second selection terminal 22a or 22b (between the second switch 20 and the switch 30, for example) passes through the filter 101 or 102, thus making it possible to filter this RF signal by using the filter 101 or 102. When filtering of this RF signal is not necessary, one of the at least two second common terminals and the second selection terminal 22c are connected to each other, so that the RF signal is able to be transmitted to the path 205 connected to the second selection terminal 22c (between the second switch 20 and the switch 30, for example) without passing through any of the filters 101 and 102. As a result, when filtering of an RF signal is not necessary, insertion loss caused by a filter is reduced.

Third Preferred Embodiment

A radio-frequency module 2b according to a third preferred embodiment of the present invention will be described below with reference to FIG. 3.

Figure 3:
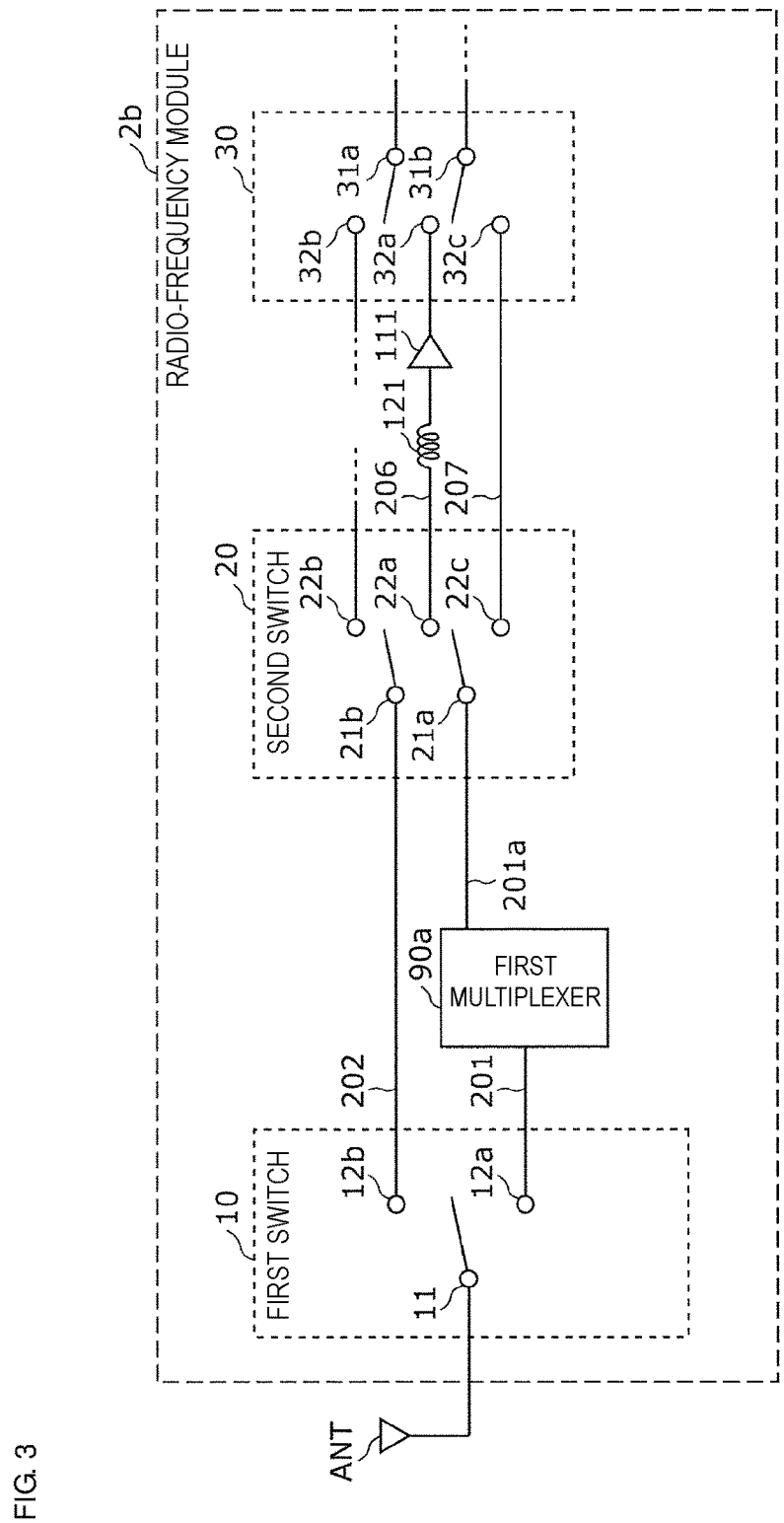
FIG. 3 is a schematic diagram illustrating an example of a radio-frequency module according to a third preferred embodiment of the present invention.

FIG. 3 is a schematic diagram illustrating an example of the radio-frequency module 2b according to the third preferred embodiment. The radio-frequency module 2b includes the switch circuit according to the second preferred embodiment, an amplifier circuit 111, and a matching circuit 121. In the second preferred embodiment, the filters are connected between the second switch 20 and the switch 30. In the third preferred embodiment, as shown in FIG. 3, the amplifier circuit 111 and the matching circuit 121 are connected between the second switch 20 and the switch 30.

A path 206 passing through the amplifier circuit 111 and a bypass path 207 bypassing the amplifier circuit 111 are directly connected to at least one second selection terminal (at least two selection terminals in the third preferred embodiment) of the second switch 20. The path 206 passing through the amplifier circuit 111 and the bypass path 207 bypassing the amplifier circuit 111 are connected to different second selection terminals.

More specifically, one of the at least two second selection terminals of the second switch 20 and one of the at least two selection terminals of the switch 30 are connected to each other via the path 206 passing through the amplifier circuit 111. In FIG. 3, the second selection terminal 22a of the second switch 20 and the selection terminal 32a of the switch 30 are connected to each other via the path 206 passing through the amplifier circuit 111.

Another one of the at least two second selection terminals of the second switch 20 and another one of the at least two selection terminals of the switch 30 are connected to each other via the bypass path 207 bypassing the amplifier circuit 111. In FIG. 3, the second selection terminal 22c of the second switch 20 and the selection terminal 32c of the switch 30 are connected to each other via the bypass path 207.

The amplifier circuit 111 is a circuit that amplifies RF signals. The amplifier circuit 111 is a low-noise amplifier (LNA) that amplifies RF received signals or a power amplifier that amplifies RF sending signals.

The matching circuit 121 is a circuit that performs impedance matching between the amplifier circuit 111 and the second switch 20. The matching circuit 121 is disposed between the second selection terminal 22a and the amplifier circuit 111 on the path 206. The matching circuit 121 may include an inductor or a capacitor, for example. In the third preferred embodiment, the matching circuit 121 preferably is defined only by an inductor, for example, but is not limited to this configuration. Matching circuits in fourth through sixth preferred embodiments, which will be discussed below, are also each preferably defined only by an inductor, for example, but are not limited to this configuration.

An RF signal received by the second common terminal 21a or 21b is amplified as a result of passing through the amplifier circuit 111. However, when an RF signal passes through an amplifier circuit, power is consumed because of the amplification of the amplifier circuit.

To address this issue, in the third preferred embodiment, at least two paths, that is, the path 206 passing through the amplifier circuit 111 and the bypass path 207 bypassing the amplifier circuit 111, are directly connected to the second switch 20. By connecting one of the at least two second common terminals and the second selection terminal 22a with each other, an RF signal transmitted through the path 206 connected to the second selection terminal 22a (between the second switch 20 and the switch 30, for example) passes through the amplifier circuit 111, thus making it possible to amplify this RF signal. When amplifying of this RF signal is not necessary, one of the at least two second common terminals and the second selection terminal 22c are connected to each other, so that the RF signal is able to be transmitted to the bypass path 207 connected to the second selection terminal 22c (between the second switch 20 and the switch 30, for example) without passing through the amplifier circuit 111. As a result, when amplifying of an RF signal is not necessary, power is not consumed by the amplifier circuit 111.

In the third preferred embodiment, the path 206 passing through the amplifier circuit 111 and the bypass path 207 bypassing the amplifier circuit 111 are separate paths connected to different terminals. However, the path 206 and the bypass path 207 may branch off from one path.

Figure 4:
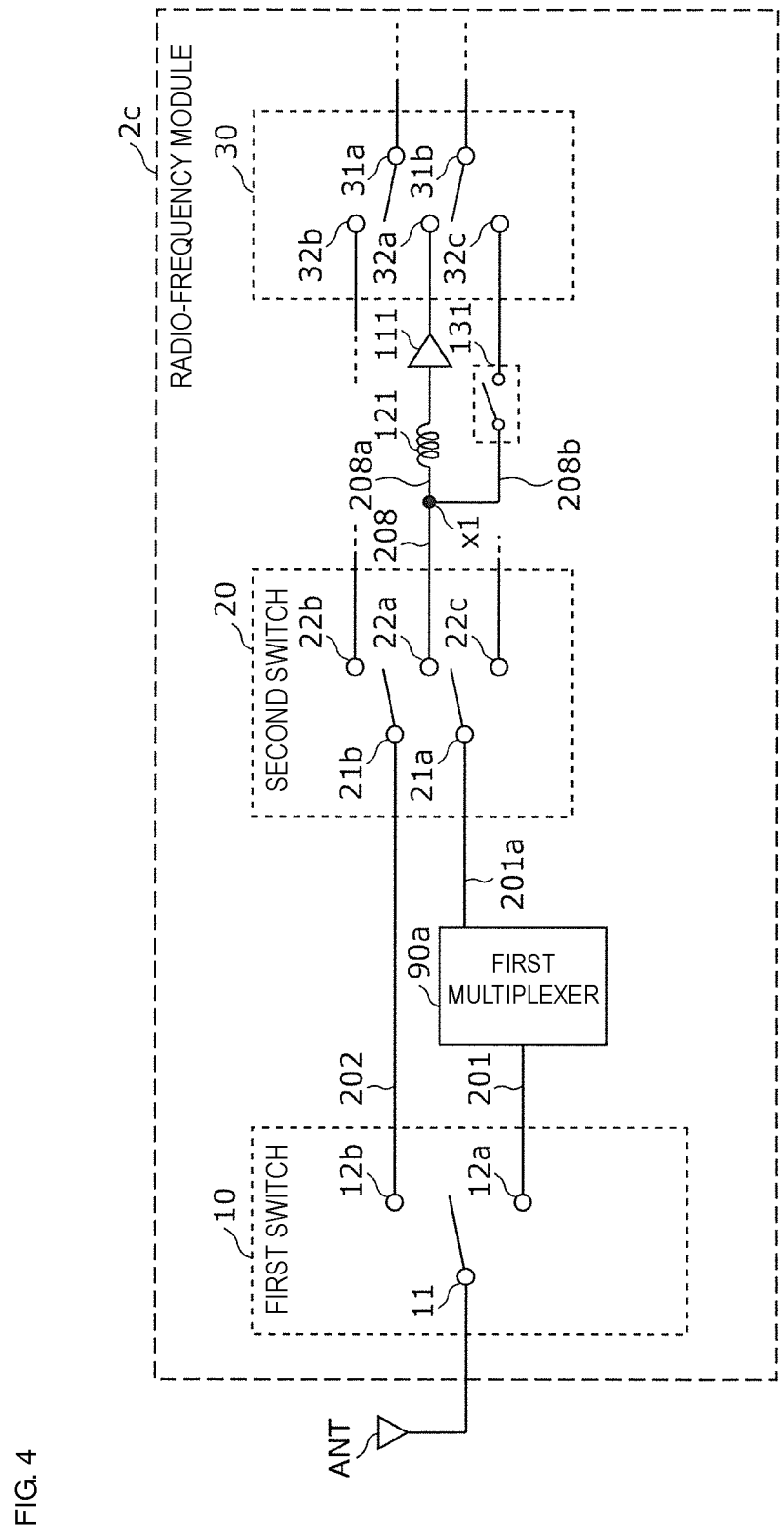
FIG. 4 is a schematic diagram illustrating an example of a radio-frequency module according to a modified example of the third preferred embodiment of the present invention.

FIG. 4 is a schematic diagram illustrating an example of a radio-frequency module 2c according to a modified example of the third preferred embodiment. The radio-frequency module 2c is different from the radio-frequency module 2b in the connection mode between the second switch 20 and the switch 30. The configurations of the other components are similar to those of the radio-frequency module 2b, and an explanation thereof will thus be omitted. In this modified example, the second switch 20 may include at least one second selection terminal. It may be sufficient if the second switch 20 includes only the second selection terminal 22a, for example.

A path 208 which branches into a path 208a passing through the amplifier circuit 111 and a bypass path 208b bypassing the amplifier circuit 111 is directly connected to one of the at least one second selection terminal of the second switch 20.

More specifically, the path 208 which branches into the path 208a passing through the amplifier circuit 111 and the bypass path 208b bypassing the amplifier circuit 111 is connected to one of the at least one second selection terminal of the second switch 20. The path 208 branches into the path 208a and the bypass path 208b at a branching point x1. In FIG. 4, the path 208 is connected to the second selection terminal 22a of the second switch 20. The path 208a passing through the amplifier circuit 111 is connected to one of the at least two selection terminals of the switch 30, and the bypass path 208b bypassing the amplifier circuit 111 is connected to another one of the at least two selection terminals of the switch 30. In FIG. 4, the selection terminal 32a is connected to the path 208a, while the selection terminal 32c is connected to the bypass path 208b. A bypass switch 131 is provided on the bypass path 208b to selectively pass or block a signal flowing through the bypass path 208b. The bypass switch 131 is a single-pole single-throw (SPST) switch. Bypass switches, which will be discussed below, are also SPST switches.

The matching circuit 121 is disposed after the branching point x1, and more specifically, between the branching point x1 and the amplifier circuit 111 on the path 208a.

An RF signal received by the second common terminal 21a or 21b is amplified as a result of passing through the amplifier circuit 111. However, when an RF signal passes through an amplifier circuit, power is consumed because of the amplification of the amplifier circuit.

To address this issue, in this modified example, the path 208 which branches into at least two paths, that is, the path 208a passing through the amplifier circuit 111 and the bypass path 208b bypassing the amplifier circuit 111, is directly connected to the second switch 20. By turning OFF the bypass switch 131 disposed on the bypass path 208b, an RF signal transmitted to the path 208a connected to the second selection terminal 22a (between the second switch 20 and the switch 30, for example) passes through the amplifier circuit 111, thus making it possible to amplify the RF signal in the amplifier circuit 111. When amplifying of this RF signal is not necessary, the bypass switch 131 is turned ON, thus allowing the RF signal to be transmitted to the path 208b connected to the second selection terminal 22a (between the second switch 20 and the switch 30, for example) without passing through the amplifier circuit 111.

As a result, when amplifying of an RF signal is not necessary, power is not consumed by the amplifier circuit 111.

Fourth Preferred Embodiment

A radio-frequency module 2d according to a fourth preferred embodiment of the present invention will be described below with reference to FIG. 5.

Figure 5:
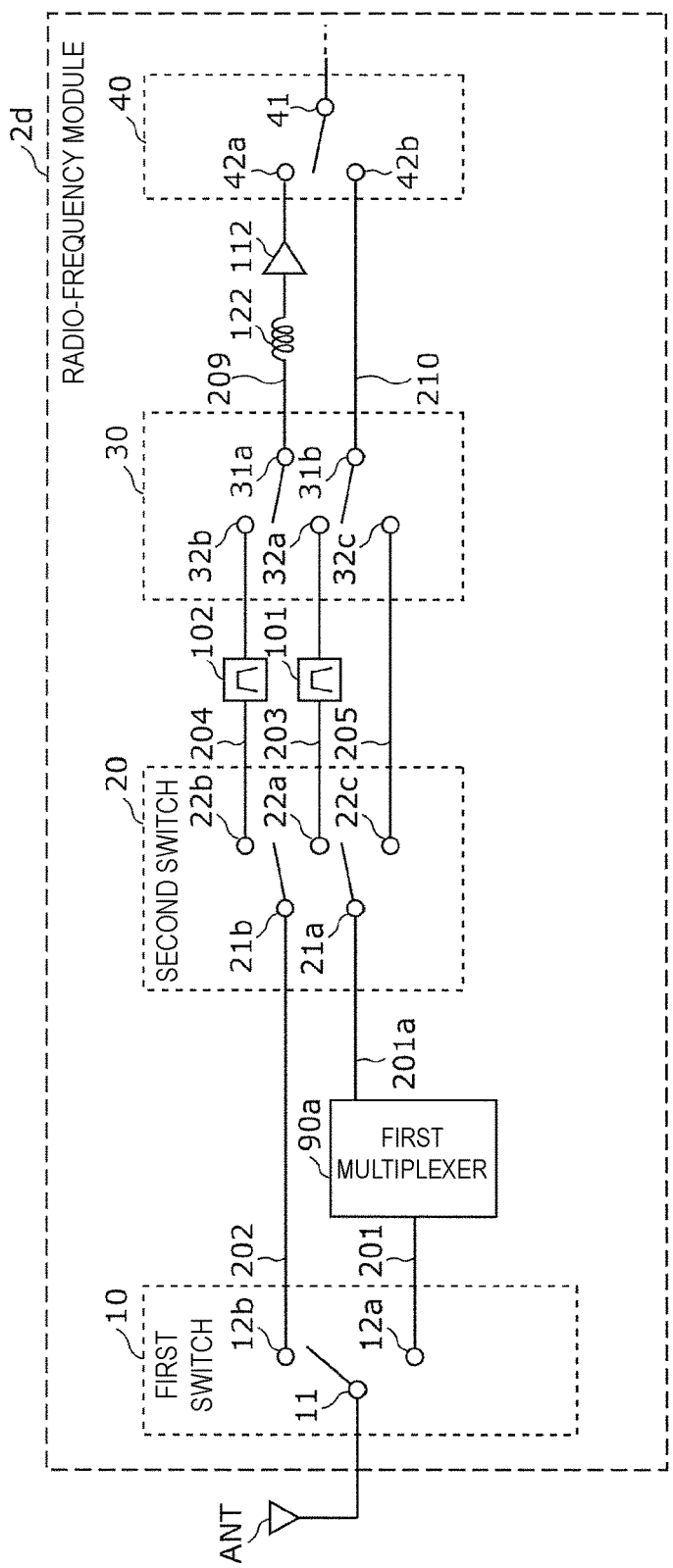
FIG. 5 is a schematic diagram illustrating an example of a radio-frequency module according to a fourth preferred embodiment of the present invention.

FIG. 5 is a schematic diagram illustrating an example of the radio-frequency module 2d according to the fourth preferred embodiment. The radio-frequency module 2d includes a switch circuit according to the fourth preferred embodiment, filters 101 and 102, an amplifier circuit 112, and a matching circuit 122. The switch circuit according to the fourth preferred embodiment includes a switch 40 in addition to the elements of the switch circuit of the second preferred embodiment. That is, the radio-frequency module 2d includes the switch 40, the amplifier circuit 112, and the matching circuit 122 in addition to the elements of the radio-frequency module 2a of the second preferred embodiment.

The switch 40 includes at least two selection terminals and at least one common terminal selectively connected to the at least two selection terminals. In the fourth preferred embodiment, the switch 40 includes two selection terminals 42a and 42b and one common terminal 41. The switch 40 may include two or more common terminals and three or more selection terminals.

A path 209 passing through the amplifier circuit 112 and a bypass path 210 bypassing the amplifier circuit 112 are indirectly connected to at least one second selection terminal (at least two selection terminals in the fourth preferred embodiment) of the second switch 20. Indirectly connecting the path 209 and the bypass path 210 to the at least one second selection terminal means that the path 209 and the bypass path 210 are connected to the at least one second selection terminal via another component (switch 30, for example). The path 209 passing through the amplifier circuit 112 and the bypass path 210 bypassing the amplifier circuit 112 are connected to different second selection terminals.

More specifically, one of the at least two common terminals of the switch 30 and one of the at least two selection terminals of the switch 40 are connected to each other via the path 209 passing through the amplifier circuit 112. In FIG. 5, the common terminal 31a of the switch 30 and the selection terminal 42a of the switch 40 are connected to each other via the path 209 passing through the amplifier circuit 112.

Another one of the at least two common terminals of the switch 30 and another one of the at least two selection terminals of the switch 40 are connected to each other via the bypass path 210 bypassing the amplifier circuit 112. In FIG. 5, the common terminal 31b of the switch 30 and the selection terminal 42b of the switch 40 are connected to each other via the bypass path 210.

The matching circuit 122 is a circuit that performs impedance matching between the amplifier circuit 112 and the switch 30. The matching circuit 122 is disposed between the common terminal 31a and the amplifier circuit 112 on the path 209.

An RF signal received by one of the selection terminals 32a through 32c of the switch 30 is amplified as a result of passing through the amplifier circuit 112. However, when an RF signal passes through an amplifier circuit, power is consumed because of the amplification of the amplifier circuit.

To address this issue, in the fourth preferred embodiment, at least two paths, that is, the path 209 passing through the amplifier circuit 112 and the bypass path 210 bypassing the amplifier circuit 112, are indirectly (via the switch 30, for example) connected to the second switch 20. That is, at least two paths, that is, the path 209 passing through the amplifier circuit 112 and the bypass path 210 bypassing the amplifier circuit 112 are connected to the switch 30. By connecting one of the at least two selection terminals of the switch 30 and the common terminal 31a of the switch 30 with each other, an RF signal transmitted through the path 209 connected to the common terminal 31a (between the second switch 20 and the switch 30, for example) passes through the amplifier circuit 112, thus making it possible to amplify this RF signal. When amplifying of this RF signal is not necessary, one of the at least two selection terminals of the switch 30 and the common terminal 31b of the switch 30 are connected to each other, so that the RF signal is able to be transmitted to the bypass path 210 connected to the common terminal 31b (between the second switch 20 and the switch 30, for example) without passing through the amplifier circuit 112. As a result, when amplifying of an RF signal is not necessary, power is not consumed by the amplifier circuit 112.

In the fourth preferred embodiment, the path 209 passing through the amplifier circuit 112 and the bypass path 210 bypassing the amplifier circuit 112 are separate paths connected to different terminals. However, the path 209 and the bypass path 210 may branch off from one path.

Figure 6:
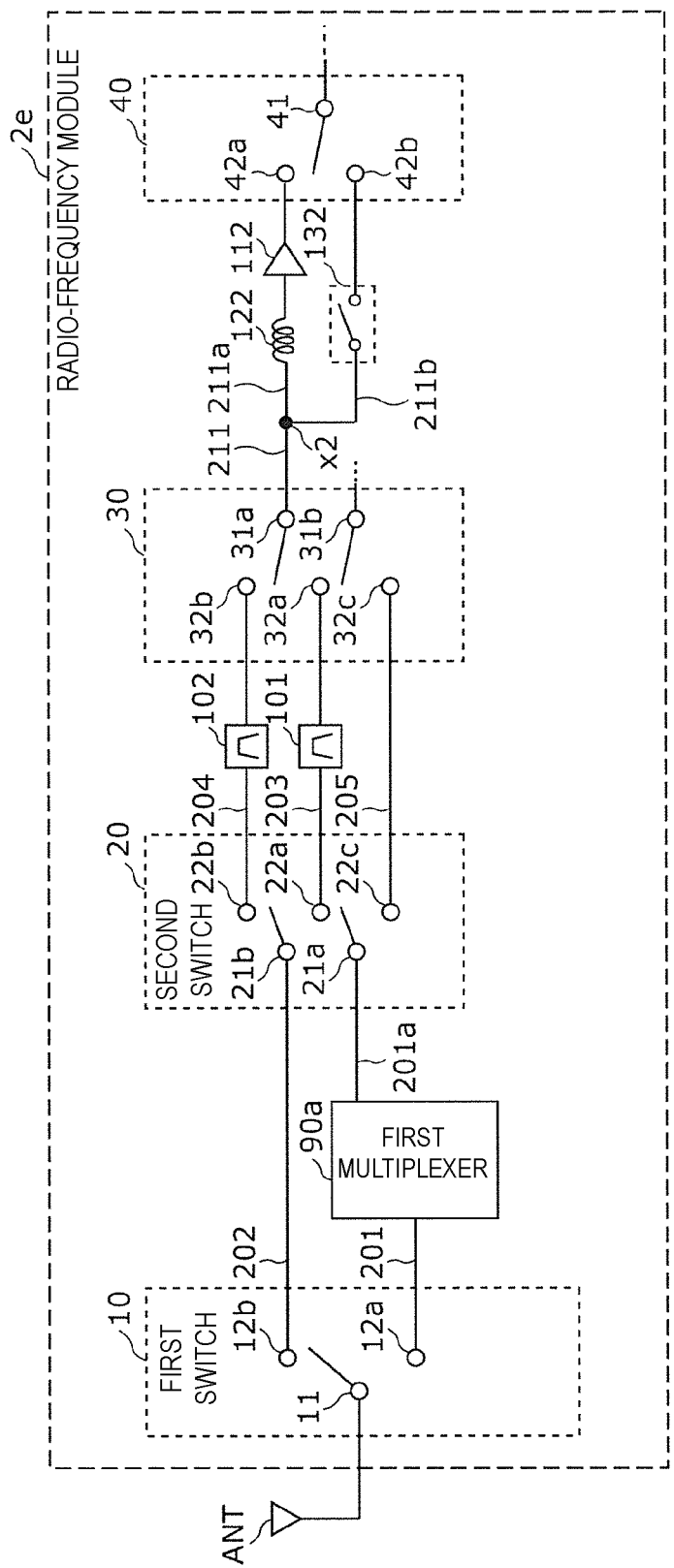
FIG. 6 is a schematic diagram illustrating an example of a radio-frequency module according to a modified example of the fourth preferred embodiment of the present invention.

FIG. 6 is a schematic diagram illustrating an example of a radio-frequency module 2e according to a modified example of the fourth preferred embodiment. The radio-frequency module 2e is different from the radio-frequency module 2d in the connection mode between the switches 30 and 40. The configurations of the other components are similar to those of the radio-frequency module 2d, and an explanation thereof will thus be omitted. In this modified example, the switch 30 may include at least one common terminal. It may be sufficient if the switch 30 includes only the common terminal 31a, for example.

A path 211 which branches into a path 211a passing through the amplifier circuit 112 and a bypass path 211b bypassing the amplifier circuit 112 is indirectly connected to at least one second selection terminal of the second switch 20.

More specifically, the path 211 which branches into the path 211a passing through the amplifier circuit 112 and the bypass path 211b bypassing the amplifier circuit 112 is connected to one of the at least one common terminal of the switch 30. The path 211 branches into the path 211a and the bypass path 211b at a branching point x2. In FIG. 6, the path 211 is connected to the common terminal 31a of the switch 30. The path 211a passing through the amplifier circuit 112 is connected to one of the at least two selection terminals of the switch 40, and the bypass path 211b bypassing the amplifier circuit 112 is connected to another one of the at least two selection terminals of the switch 40. In FIG. 6, the selection terminal 42a is connected to the path 211a, while the selection terminal 42b is connected to the bypass path 211b. A bypass switch 132 is provided on the bypass path 211b to selectively pass or block a signal flowing through the bypass path 211b.

The matching circuit 122 is disposed after the branching point x2, and more specifically, between the branching point x2 and the amplifier circuit 112 on the path 211a.

An RF signal received by one of the selection terminals 32a through 32c of the switch 30 is amplified as a result of passing through the amplifier circuit 112. However, when an RF signal passes through an amplifier circuit, power is consumed because of the amplification of the amplifier circuit.

To address this issue, in this modified example, the path 211 which branches into at least two paths, that is, the path 211a passing through the amplifier circuit 112 and the bypass path 211b bypassing the amplifier circuit 112, is indirectly (via the switch 30, for example) connected to the second switch 20. That is, the path 211 which branches into at least two paths, that is, the path 211a passing through the amplifier circuit 112 and the bypass path 211b bypassing the amplifier circuit 112, is connected to the switch 30. By turning OFF the bypass switch 132 disposed on the bypass path 211b, an RF signal transmitted to the path 211a connected to the switch 30 (between the second switch 20 and the switch 30, for example) passes through the amplifier circuit 112, thus making it possible to amplify the RF signal in the amplifier circuit 112. When amplifying of this RF signal is not necessary, the bypass switch 132 is turned ON, thus allowing the RF signal to be transmitted to the path 211b connected to the switch 30 (between the second switch 20 and the switch 30, for example) without passing through the amplifier circuit 112. As a result, when amplifying of an RF signal is not necessary, power is not consumed by the amplifier circuit 112.

Fifth Preferred Embodiment

A radio-frequency module 2f according to a fifth preferred embodiment of the present invention will be described below with reference to FIG. 7. In the fifth preferred embodiment, a path connected to another one of the terminals at the other ends of the filters in the first multiplexer 90a, which is a terminal different from that connected to the path 201a, will be described.

Figure 7:
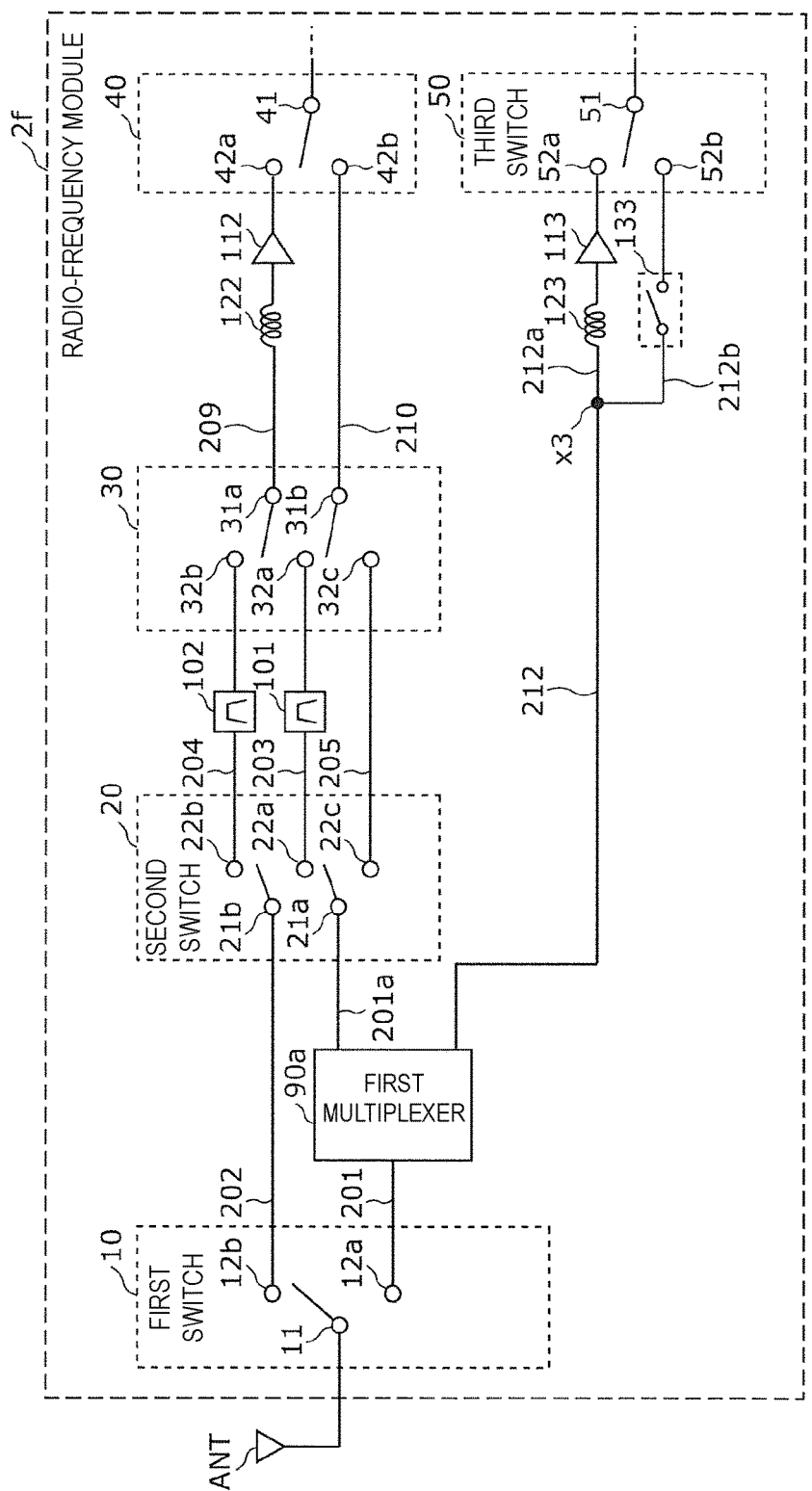
FIG. 7 is a schematic diagram illustrating an example of a radio-frequency module according to a fifth preferred embodiment of the present invention.

FIG. 7 is a schematic diagram illustrating an example of the radio-frequency module 2f according to the fifth preferred embodiment. The radio-frequency module 2f is a radio-frequency module in which a path 212 is connected to the first multiplexer 90a of the radio-frequency module 2e of the fourth preferred embodiment. The radio-frequency module 2f may be a radio-frequency module in which the path 212 is connected to the first multiplexer 90a of one of the radio-frequency modules 2a through 2c (switch circuits) of the first through third preferred embodiments and the modified example of the third preferred embodiment.

The radio-frequency module 2f includes the switch circuit according to the fifth preferred embodiment, filters, amplifier circuits, and matching circuits. The switch circuit according to the fifth preferred embodiment includes a third switch in addition to the components of the switch circuit of the fourth preferred embodiment.

The third switch 50 includes at least two third selection terminals and at least one third common terminal selectively connected to the at least two third selection terminals. In the fifth preferred embodiment, the third switch 50 includes two third selection terminals 52a and 52b and one third common terminal 51. The third switch 50 may include two or more third common terminals and three or more third selection terminals.

The path 212 which branches into a path 212a passing through an amplifier circuit 113 and a bypass path 212b bypassing the amplifier circuit 113 is connected to the first multiplexer 90a. More specifically, the path 212 is connected to a terminal different from the terminal to which the path 201a is connected among the terminals at the other ends of the filters in the first multiplexer 90a. The path 212 branches into the path 212a and the bypass path 212b at a branching point x3. The path 212a passing through the amplifier circuit 113 is connected to one of the at least two third selection terminals of the third switch 50, while the bypass path 212b bypassing the amplifier circuit 113 is connected to another one of the at least two third selection terminals. In FIG. 7, the path 212a is connected to the third selection terminal 52a, while the bypass path 212b is connected to the third selection terminal 52b. A bypass switch 133 is provided on the bypass path 212b to selectively pass or block a signal flowing through the bypass path 212b.

The matching circuit 123 is disposed after the branching point x3, and more specifically, between the branching point x3 and the amplifier circuit 113 on the path 212a.

An RF signal propagating through the path 212 is amplified as a result of passing through the amplifier circuit 113. However, when an RF signal passes through an amplifier circuit, power is consumed because of the amplification of the amplifier circuit. This leads to a waste of power if an RF signal which is not required to be amplified passes through the amplifier circuit.

To address this issue, in the fifth preferred embodiment, the first multiplexer 90a and the third switch 50 are connected to each other by at least two paths, that is, the path 212a passing through the amplifier circuit 113 and the bypass path 212b bypassing the amplifier circuit 113. By turning OFF the bypass switch 133 disposed on the bypass path 212b, an RF signal transmitted between the first multiplexer 90a and the third switch passes through the amplifier circuit 113, thus making it possible to amplify the RF signal in the amplifier circuit 113. When amplifying of this RF signal is not necessary, the bypass switch 133 is turned ON, thus allowing the RF signal to be transmitted between the first multiplexer 90a and the third switch 50 without passing through the amplifier circuit 113. As a result, when amplifying of an RF signal is not necessary, power is not consumed by the amplifier circuit 113.

In the modified examples of the third and fourth preferred embodiments and the fifth preferred embodiment, the matching circuit is disposed after the branching point. However, the matching circuit may be disposed before the branching point. A description will now be given of the radio-frequency module 2f including a matching circuit 123 disposed before the branching point of the path 212 according to a modified example of the fifth preferred embodiment.

Figure 8:
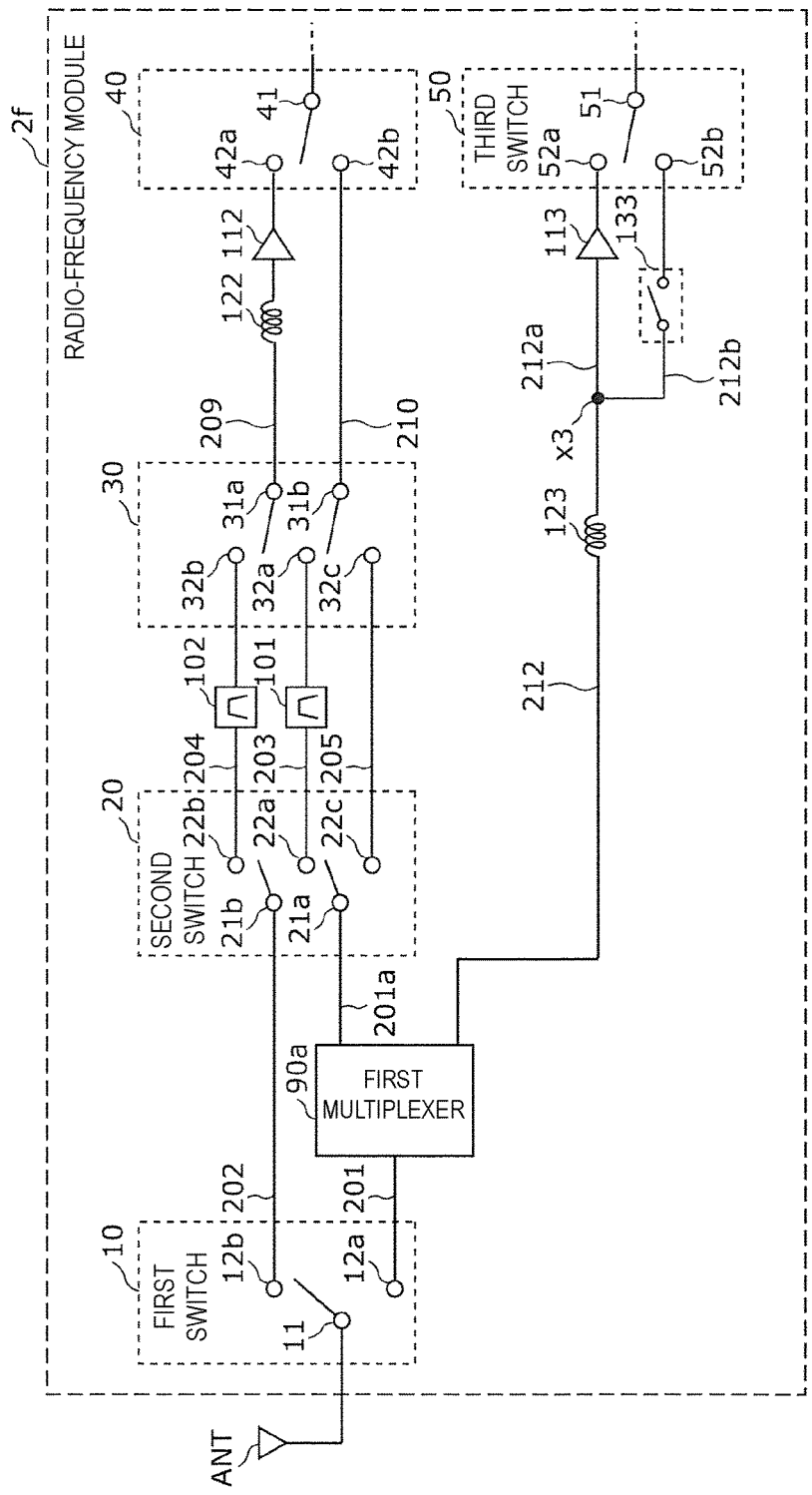
FIG. 8 is a schematic diagram illustrating an example of a radio-frequency module according to a modified example of the fifth preferred embodiment of the present invention.

FIG. 8 is a schematic diagram illustrating an example of the radio-frequency module 2f according to the modified example of the fifth preferred embodiment. The matching circuit 123 is disposed between the first multiplexer 90a and the branching point x3.

Providing a switch and an amplifier circuit into one chip (semiconductor chip) reduces the size of a module on which the switch and the amplifier circuit are mounted. For example, the third switch 50, the bypass switch 133, and the amplifier circuit 113 may be provided in and defined by one chip. It may however be necessary to adjust impedance matching between the amplifier circuit 113 and a component connected to the amplifier circuit 113 (first multiplexer 90a in this example) according to the environments where the module is used. Consequently, the matching circuit 123 that performs such impedance matching may not be provided in the same chip as that of the third switch 50, the bypass switch 133, and the amplifier circuit 113.

Figure 9A:
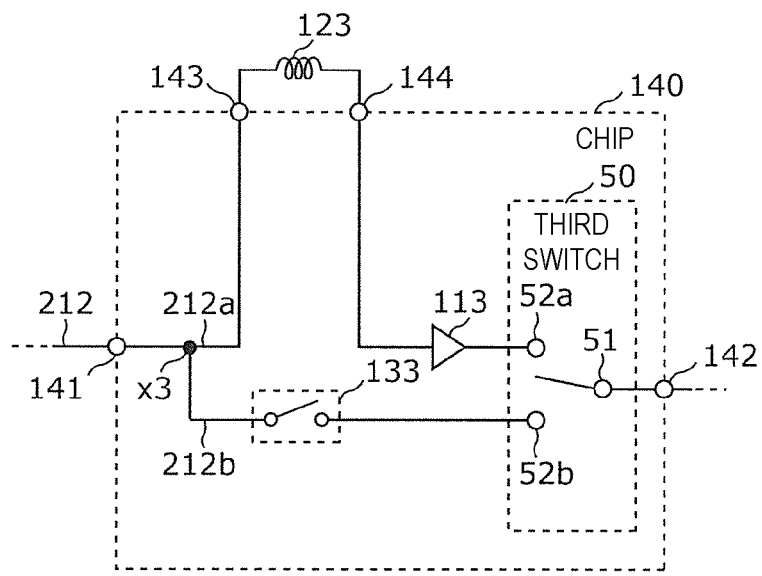
FIG. 9A is a schematic diagram illustrating an example of a chip according to the fifth preferred embodiment of the present invention.
Figure 9B:
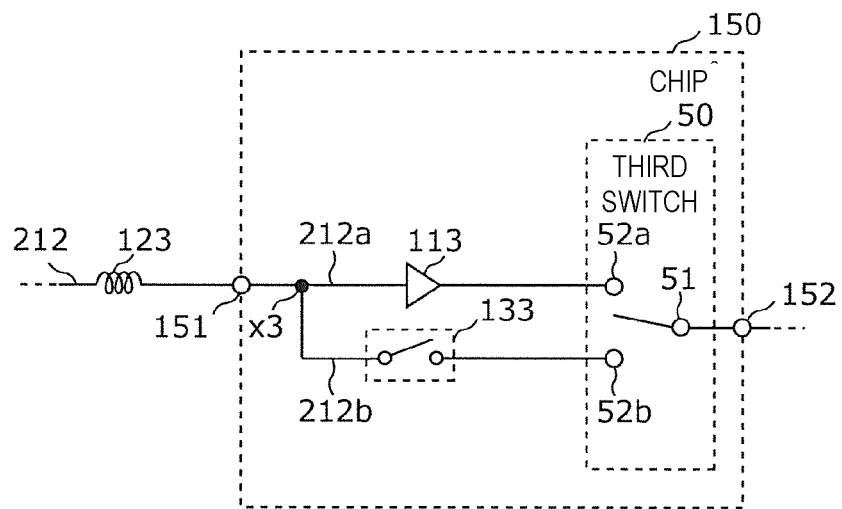
FIG. 9B is a schematic diagram illustrating an example of a chip according to the modified example of the fifth preferred embodiment of the present invention.

FIG. 9A is a schematic diagram illustrating an example of a chip 140 according to the fifth preferred embodiment. FIG. 9B is a schematic diagram illustrating an example of a chip 150 according to the modified example of the fifth preferred embodiment.

Typically, as shown in FIG. 9A, the matching circuit 123 provided between the branching point x3 and the amplifier circuit 113 is disposed outside the chip 140. The chip 140 thus includes two terminals 143 and 144 to connect the matching circuit 123 to the chip 140 in addition to two terminals 141 and 142 to input and output RF signals, thus increasing the size of the chip 140. It is also necessary to extend a signal path to connect the matching circuit 123 from the chip 140 to the outside, thus increasing the length of the signal path.

In contrast, as shown in FIG. 9B, in the chip 150 according to the modified example of the fifth preferred embodiment, the matching circuit 123 is disposed before the branching point x3 of the path 212. The matching circuit 123 is thus able to be connected to a terminal 151 used to input and output RF signals and be disposed outside the chip 150. In this modified example, since the matching circuit 123 is disposed before the branching point x3 of the path 212, it is not necessary to provide terminals to connect the matching circuit 123 to the chip 150 other than the terminals 151 and 152 to input and output RF signals, thus reducing the size of the chip 150.

Typically, if a matching circuit, which performs impedance matching between an amplifier circuit and a component connected to the amplifier circuit, is disposed before a branching point of a path, an RF signal which will pass through a bypass path bypassing the amplifier circuit passes through the matching circuit. In this case, the frequency band of this RF signal may deviate from a desirable band as a result of passing through the matching circuit. In contrast, in the fifth preferred embodiment, as shown in FIG. 7, the matching circuit 123 is disposed between the branching point x3 of the path 212 and the amplifier circuit 113. Thus, an RF signal which passes through the path 212a passes through the matching circuit 123 and is thus subjected to impedance matching by the matching circuit 123. An RF signal which passes through the bypass path 212b bypassing the amplifier circuit 113 does not pass through the matching circuit 123 and is not subjected to impedance matching.

Sixth Preferred Embodiment

In the radio-frequency modules 2a through 2f of the second through fifth preferred embodiments and modified examples, RF signals received by the antenna ANT propagate through the radio-frequency modules 2a through 2f. In a sixth preferred embodiment of the present invention, RF signals to be sent from the antenna ANT also propagate through a radio-frequency module.

Figure 10:
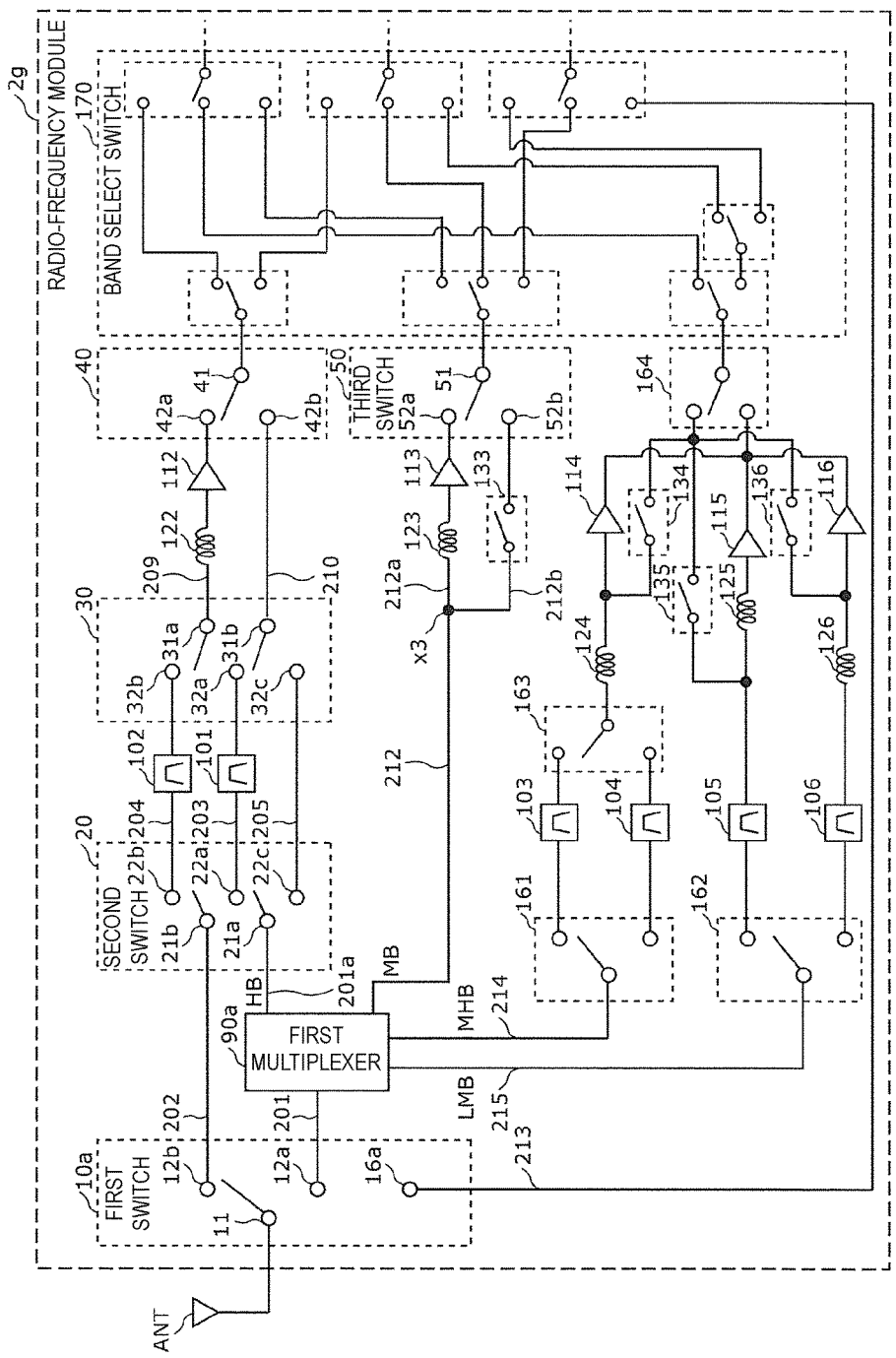
FIG. 10 is a schematic diagram illustrating an example of a radio-frequency module according to a sixth preferred embodiment of the present invention.

FIG. 10 is a schematic diagram illustrating an example of a radio-frequency module 2g according to the sixth preferred embodiment. The radio-frequency module 2g is different from the radio-frequency module 2f of the fifth preferred embodiment in that it includes a first switch 10a instead of the first switch 10 and also includes other components (such as switches, filters, amplifier circuits, and matching circuits connected to paths 214 and 215, which will be discussed later).

The first switch 10a includes at least three first selection terminals. In FIG. 10, two of the at least three first selection terminals are first selection terminals 12a and 12b, and another first selection terminal is a sending first selection terminal 16a. The sending first selection terminal 16a is connected to a bypass path 213 which bypasses the first multiplexer 90a and the amplifier circuits.

The paths 201a, 212, 214, and 215 are connected to the first multiplexer 90a. Among the plural filters of the first multiplexer 90a, the path 201a is connected to the terminal at the other end of a filter having the HB as the pass band, the path 212 is connected to the terminal at the other end of a filter having the MB as the pass band, the path 214 is connected to the terminal at the other end of a filter having the MHB as the pass band, and the path 215 is connected to the terminal at the other end of a filter having the LMB as the pass band.

The path 214 is connected to a common terminal of a switch 161, and filters 103 and 104 are connected to two selection terminals of the switch 161. The path 215 is connected to a common terminal of a switch 162, and filters 105 and 106 are connected to two selection terminals of the switch 162.

The filters 101 and 102 have different HB frequency bands as the pass bands. The filters 103 and 104 have different MHB frequency bands as the pass bands. The filters 105 and 106 have different LMB frequency bands as the pass bands.

The filters 103 and 104 are connected to two selection terminals of a switch 163. A path that branches into a path passing through an amplifier circuit 114 and a bypass path bypassing the amplifier circuit 114 is connected to a common terminal of the switch 163. A bypass switch 134 is provided on the bypass path bypassing the amplifier circuit 114. A matching circuit 124 is disposed before a branching point of this path to perform impedance matching between the switch 163 and the amplifier circuit 114.

A path that branches into a path passing through an amplifier circuit 115 and a bypass path bypassing the amplifier circuit 115 is connected to the filter 105. A bypass switch 135 is provided on the bypass path bypassing the amplifier circuit 115. A matching circuit 125 is disposed between a branching point of this path and the amplifier circuit 115 to perform impedance matching between the filter 105 and the amplifier circuit 115.

A path that branches into a path passing through an amplifier circuit 116 and a bypass path bypassing the amplifier circuit 116 is connected to the filter 106. A bypass switch 136 is provided on the bypass path bypassing the amplifier circuit 116. A matching circuit 126 is disposed before a branching point of this path to perform impedance matching between the filter 106 and the amplifier circuit 116.

The paths passing through the amplifier circuits 114 through 116 are connected to one of two selection terminals of a switch 164, while the bypass paths bypassing the amplifier circuits 114 through 116 are connected to the other one of the two selection terminals of the switch 164. A band select switch 170 is connected to a common terminal of the switch 164. That is, the switch 164 selects one of an RF received signal (LMB or MHB RF received signal) amplified by a corresponding one of the amplifier circuits 114 through 116 and an RF received signal that has not been amplified by a corresponding one of the amplifier circuits 114 through 116, and supplies the selected RF received signal to the band select switch 170.

The band select switch 170 is connected to the common terminal 41 of the switch 40. The switch 40 selects one of an RF received signal (HB RF received signal or RF received signal which has not passed through the first multiplexer 90a) amplified by the amplifier circuit 112 and an RF received signal that has not been amplified by the amplifier circuit 112, and supplies the selected RF received signal to the band select switch 170.

The band select switch 170 is connected to the third common terminal 51 of the third switch 50. The third switch 50 selects one of an RF received signal (MB RF received signal) amplified by the amplifier circuit 113 and an RF received signal that has not been amplified by the amplifier circuit 113, and supplies the selected RF received signal to the band select switch 170.

The band select switch 170 is connected to an RF signal processing circuit (not shown), for example, and assigns multiple RF received signals of different frequency bands to associated terminals of the RF signal processing circuit. When the antenna ANT is used to send RF signals, the band select switch 170 connects the RF signal processing circuit and the bypass path 213. An explanation of details of the band select switch 170 will be omitted.

In the sixth preferred embodiment, the sending first selection terminal 16a is connected to the bypass path 213 bypassing the first multiplexer 90a and the amplifier circuits. However, instead of being connected to the bypass path 213, the sending first selection terminal 16a may be connected to a path connected to a terminal of an external component disposed outside the radio-frequency module 2g.

In the sixth preferred embodiment, when the first common terminal 11 of the first switch 10a is connected to the first selection terminal 12a or 12b, the antenna ANT preferably is used as a receive antenna. When the first common terminal 11 is connected to the sending first selection terminal 16a, the antenna ANT is used as a transmit antenna. The antenna ANT is thus able to be used as a transmit-and-receive antenna, thus reducing the size of a communication device, such as a cellular phone.

Seventh Preferred Embodiment

A switch circuit 3 according to a seventh preferred embodiment of the present invention will be described below with reference to FIG. 11.

Figure 11:
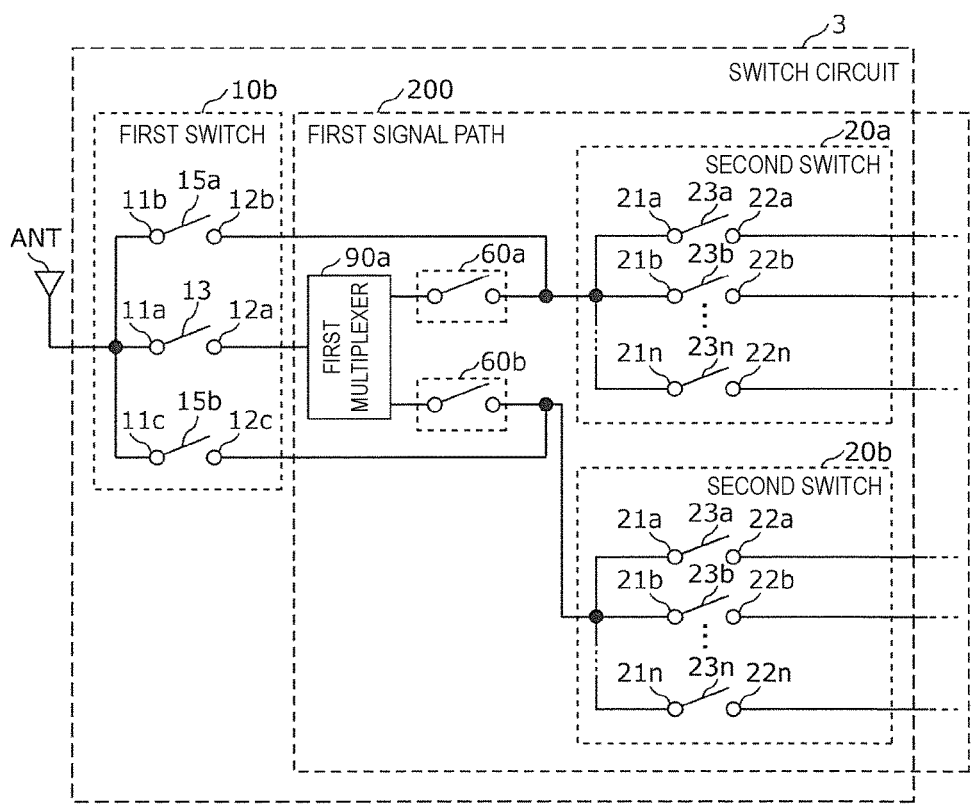
FIG. 11 is a schematic diagram illustrating an example of a switch circuit according to a seventh preferred embodiment of the present invention.

FIG. 11 is a schematic diagram illustrating an example of the switch circuit 3 according to the seventh preferred embodiment.

The switch circuit 3 is a circuit that can receive signals of different frequency bands received by the antenna ANT. That is, the switch circuit 3 is a CA-support switch.

The switch circuit 3 includes a first switch 10b, two or more second switches 20, and a first multiplexer 90a. In the seventh preferred embodiment, the switch circuit 3 includes second switches 20a and 20b, which are collectively called the second switch 20.

The first switch 10b includes a first common terminal 11 connected to the antenna ANT and at least two first selection terminals (first selection terminals 12a through 12c in FIG. 11) connected to a first signal path 200. In the seventh preferred embodiment, the first switch 10b includes first common terminals 11a through 11c, which are collectively called the first common terminal 11. The first common terminals 11a through 11c are connected to each other, and are thus regarded as the single first common terminal 11. The first switch 10b includes switches 13 and 15. Switches 15a and 15b are collectively called the switch 15. Turning ON the switch 13 connects the first common terminal 11a and the first selection terminal 12a. Turning ON the switch 15a connects the first common terminal 11b and the first selection terminal 12b. Turning ON the switch 15b connects the first common terminal 11c and the first selection terminal 12c. When the switch 13 is ON, the switches 15a and 15b are OFF. When at least one of the switches 15a and 15b is ON, the switch 13 is OFF.

The switches 13 and 15 are semiconductor switches such as diode switches or FET switches, and are turned ON or OFF in accordance with a control signal from an external source (RF signal processing circuit, for example) outside the first switch 10b. The first common terminals 11a through 11c may be one integrated terminal, such as the first common terminal 11 of the first switch 10. In this case, instead of the switches 13 and 15, the first switch 10b includes a switch that changes the connection between the integrated first common terminal 11 and one of the first selection terminals 12a through 12c. However, the first common terminal 11 may still be able to simultaneously connect to the first selection terminal 12a and to the first selection terminal 12b or 12c.

The second switch 20 includes at least one second common terminal 21 connected to the first selection terminals 12a through 12c and also includes at least two selection terminals 22. In this case, the second common terminal 21 may be connected to the first selection terminals 12a through 12c via another circuit (the first multiplexer 90a or a matching circuit 180, which will be discussed later, for example). The second switch 20 includes a switch 23. Turning ON the switch 23 connects the second common terminal 21 and the second selection terminal 22. In the seventh preferred embodiment, the second switch 20 includes n second common terminals, that is, second common terminals 21a, 21b, . . . , and 21n, which are collectively called the second common terminal 21. The second switch 20 also includes n second selection terminals, that is, second selection terminals 22a, 22b, . . . , and 22n, which are collectively called the second selection terminal 22. The second common terminals 21a through 21n are connected to each other, and are thus regarded as the single second common terminal 21. That is, in the seventh preferred embodiment, the at least one second common terminal 21 is the second common terminal 21. In the seventh preferred embodiment, the second switch 20 includes n switches, that is, switches 23a, 23b, . . . , and 23n, which are collectively called the switch 23. Turning ON the switch 23n, for example, connects the second common terminal 21n and the second selection terminal 22n.

The switch 23 is a semiconductor switch such as a diode switch or an FET switch, and is turned ON or OFF in accordance with a control signal from an external source (RF signal processing circuit, for example) outside the second switch 20. The second common terminals 21a, 21b, . . . , and 21n may be one integrated terminal. In this case, instead of the switches 23a, 23b, . . . , and 23n, the second switch 20 includes a switch that changes the connection between the integrated second common terminal 21 and one of the second selection terminals 22a, 22b, . . . , and 22n. However, the second common terminal 21 may still be able to simultaneously connect to two or more of the second selection terminals 22a, 22b, . . . , and 22n.

The second switch 20 is disposed on the first signal path 200. This means that the second switch 20 is disposed on a path connected to the first selection terminals 12a through 12c of the first switch 10b. For example, when the first common terminal 11b and the first selection terminal 12b are connected to each other and when the second common terminal 21n and the second selection terminal 22n of the second switch 20a are connected to each other, a signal passes through a path connecting the first selection terminal 12b, the second common terminal 21n, and the second selection terminal 22n as the first signal path 200.

A signal received by the antenna ANT passes through the first signal path 200 when the first common terminal 11 and at least one of the first selection terminals 12a through 12c are connected to each other. That is, the first signal path 200 is a path that transmits a signal received by the antenna ANT. A receiving filter (filter including an elastic wave resonator or an LC circuit) or an amplifier circuit, such as an LNA, is thus connected to the second selection terminal 22 of the second switch 20. Filters having different pass bands from each other are connected to the second selection terminals 22a, 22b, . . . , and 22n, so that the switch circuit 3 is able to receive signals of different frequency bands by using the second switch 20.

The first selection terminal 12a, which is one of the first selection terminals 12a through 12c, and the second common terminal 21 of each of the two or more second switches 20 are connected to each other via a path passing through the first multiplexer 90a.

The first selection terminal 12b (and the first selection terminal 12c in the seventh preferred embodiment), which is another one of the first selection terminals 12a through 12c, and one second common terminal 21 are connected to each other via a bypass path bypassing the first multiplexer 90a.

A fourth switch 60a is connected between the first multiplexer 90a and one second common terminal 21 of the second switch 20a. More specifically, as shown in FIG. 11, the switch circuit 3 includes the fourth switch 60a at a position closer to the first multiplexer 90a than to a node between a path connected to the first selection terminal 12b and a path connecting the first multiplexer 90a and the second switch 20a. Similarly, the switch circuit 3 includes a fourth switch 60b between the first multiplexer 90a and the second switch 20b. In the seventh preferred embodiment, the fourth switches 60a and 60b are collectively called the fourth switch 60.

The fourth switch 60 is a semiconductor switch such as a diode switch or an FET switch, and is turned ON or OFF in accordance with a control signal from an external source (RF signal processing circuit, for example) outside the switch circuit 3.

By using the first multiplexer 90a, the switch circuit 3 is able to receive multiple signals of different frequency bands received by the antenna ANT, thus making it possible to achieve CA communication. However, when a received signal passes through the first multiplexer 90a, signal loss (insertion loss) occurs because of the first multiplexer 90a.

To address this issue, in the seventh preferred embodiment, the switch circuit 3 preferably has the following structure. A signal received by the antenna ANT is transmitted to the first signal path 200 via the first multiplexer 90a when the first common terminal 11 and the first selection terminal 12a are connected to each other and when the fourth switch 60 is turned ON. In contrast, a signal received by the antenna ANT is transmitted to the first signal path 200 without passing through the first multiplexer 90a when the first common terminal 11 and the first selection terminal 12b or 12c are connected to each other and when the fourth switch 60 is turned OFF.

This will be explained more specifically. When the first common terminal 11a and the first selection terminal 12a are connected to each other by turning ON the switch 13 and when the fourth switches 60a and 60b are turned ON, a signal received by the antenna ANT is able to be transmitted to the first signal path 200 via the first multiplexer 90a. In contrast, when the first common terminal 11b and the first selection terminal 12b are connected to each other by turning ON the switch 15a and when the fourth switch 60a is turned OFF, a signal received by the antenna ANT is able to be transmitted to the first signal path 200 without passing through the first multiplexer 90a. Similarly, when the first common terminal 11c and the first selection terminal 12c are connected to each other by turning ON the switch 15b and when the fourth switch 60b is turned OFF, a signal received by the antenna ANT is able to be transmitted to the first signal path 200 without passing through the first multiplexer 90a.

With the above-described configuration, when CA communication is not performed, insertion loss which may occur in a received signal is reduced.

The switch circuit 3 is able to support CA communication and also to reduce insertion loss caused by the first multiplexer 90a when CA communication is not performed.

Eighth Preferred Embodiment

A switch circuit 3a according to an eighth preferred embodiment of the present invention will be described below with reference to FIG. 12.

Figure 12:
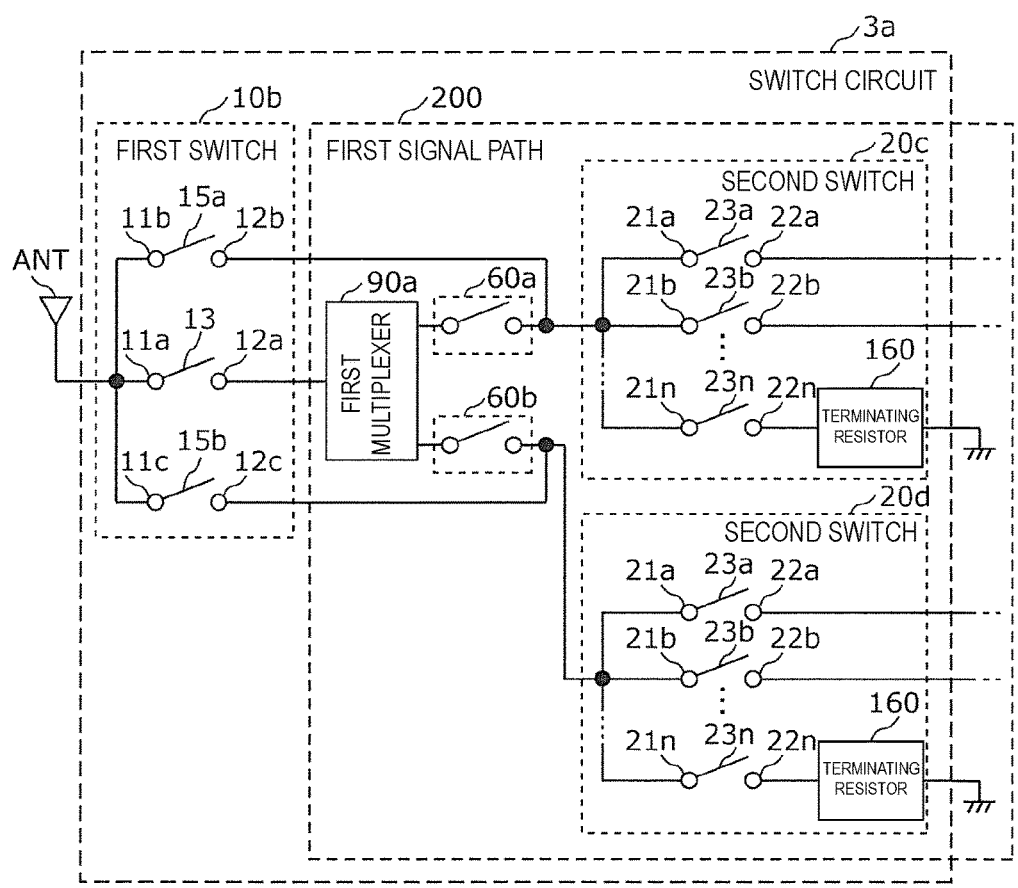
FIG. 12 is a schematic diagram illustrating an example of a switch circuit according to an eighth preferred embodiment of the present invention.

FIG. 12 is a schematic diagram illustrating an example of the switch circuit 3a according to the eighth preferred embodiment.

The switch circuit 3a according to the eighth preferred embodiment is different from the switch circuit 3 according to the seventh preferred embodiment in that it includes second switches 20c and 20d instead of the second switches 20a and 20b. The configurations of the other components are similar to those of the seventh preferred embodiment, and an explanation thereof will thus be omitted. The second switches 20c and 20d are different from the second switches 20a and 20b in that they each include a terminating resistor 160. The configurations of the other components of the second switches 20c and 20d are similar to those of the seventh preferred embodiment, and an explanation thereof will thus be omitted. The functions of the second switches 20c and 20d are the same, and an explanation only of the second switch 20c will be given.

The terminating resistor 160 is connected to one of at least two second selection terminals 22 of the second switch 20c. One end of the terminating resistor 160 is connected to the second selection terminal 22, while the other end thereof is grounded. The terminating resistor 160 outputs energy of a signal input into the second switch 20c to a ground, and the resistance of the terminating resistor 160 is about 50Ω, for example. The terminating resistor 160 may be built in the second switch 20c. In the eighth preferred embodiment, the terminating resistor 160 is connected to the second selection terminal 22n, as shown in FIG. 12.

A high power signal received by the antenna ANT may leak to the second switch 20c even when the first common terminal 11 and the first selection terminal 12a are not connected to each other. A circuit, such as a filter that filters a received signal or an LNA that amplifies a received signal, is connected to the second switch 20c. When receiving a high power signal, such a circuit may be broken or the performance may be decreased. To address this issue, the terminating resistor 160 is connected to one of the at least two second selection terminals 22 of the second switch 20c. By connecting the second common terminal 21 and the second selection terminal 22 to which the terminating resistor 160 is connected, the terminating resistor 160 is able to output energy of a high power signal to a ground. It is thus less likely that a circuit, such as a filter or an LNA, connected to the second switch 20c will be broken or the performance will be decreased.

Ninth Preferred Embodiment

A switch circuit 3b according to a ninth preferred embodiment of the present invention will be described below with reference to FIG. 13.

Figure 13:
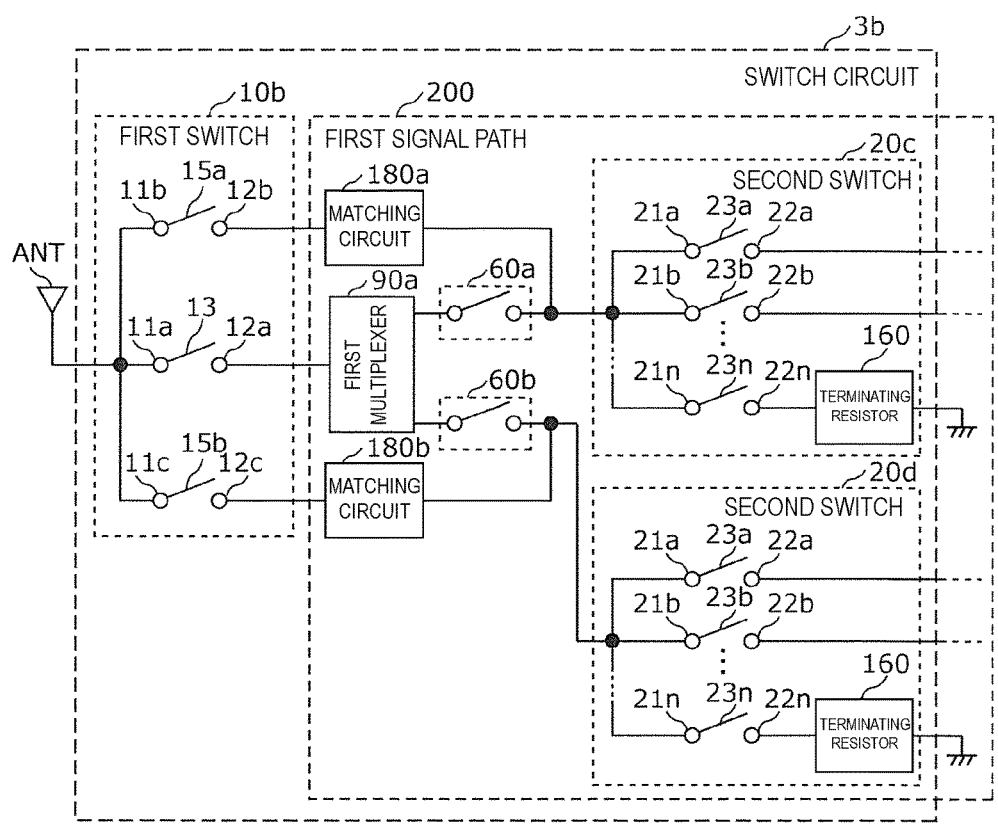
FIG. 13 is a schematic diagram illustrating an example of a switch circuit according to a ninth preferred embodiment of the present invention.

FIG. 13 is a schematic diagram illustrating an example of the switch circuit 3b according to the ninth preferred embodiment.

The switch circuit 3b according to the ninth preferred embodiment is different from the switch circuit 3a according to the eighth preferred embodiment in that it includes a matching circuit 180. The configurations of the other components are similar to those of the eighth preferred embodiment, and an explanation thereof will thus be omitted. In the ninth preferred embodiment, the switch circuit 3b includes matching circuits 180a and 180b, which are collectively called the matching circuit 180.

The matching circuit 180a is connected between the first selection terminal 12b of the first switch 10b and the second common terminal 21 of the second switch 20c. The matching circuit 180b is connected between the first selection terminal 12c of the first switch 10b and the second common terminal 21 of the second switch 20d. A matching circuit 180 may be connected between the first selection terminal 12a and the second common terminal 21, though it is not shown. The first multiplexer 90a may have the function of a matching circuit 180. The first multiplexer 90a and a matching circuit 180 may be provided integrally. The matching circuit 180 is an impedance matching circuit including elements, such as capacitors or inductors. The matching circuit 180 performs impedance matching between the first switch 10b and each of the second switches 20c and 20d, thus decreasing the level of loss (return loss) which may occur in a signal transmitted to the first signal path 200.

As described above, filters having different pass bands from each other are connected to the at least two second selection terminals 22 of each of the second switches 20c and 20d. That is, the frequency band for which the matching circuit 180 performs impedance matching differs depending on which switch 23 will be turned ON. The matching circuit 180 predicts which switch 23 in the second switch 20c or 20d will be turned ON and adjusts itself in advance to the frequency band of a signal to be subjected to impedance matching. If the parameter used to perform impedance matching in the matching circuit 180 is variable, a control signal for turning ON or OFF the switch 23 received by the second switches 20c and 20d is also received by the matching circuit 180. That is, the matching circuit 180 is able to identify the switch 23 to be turned ON in the second switch 20c or 20d, that is, the matching circuit 180 can identify the frequency band to be subjected to impedance matching. The matching circuit 180 includes plural circuits having different parameters, such as the value of an inductor or a capacitor, or having different connection modes. In each of these circuits, the parameter, such as the value of an inductor or a capacitor, or the connection mode has been adjusted so that impedance matching is performed according to the associated frequency band. The matching circuit 180 includes a switch that is able to select one of these circuits to be connected between the first switch 10b and the second switch 20c or 20d in accordance with a control signal received by the matching circuit 180. This configuration enables the matching circuit 180 to perform impedance matching for the frequency band associated with the switch 23 to be turned ON in the second switch 20c or 20d.

As described above, the impedance matching parameter or the connection mode of the matching circuit 180 is adjusted in advance to the frequency band to be subjected to impedance matching, or is changed in accordance with a control signal for turning ON or OFF the switch 23 received by the second switch 20c or 20d. It is thus possible to achieve optimal impedance matching according to the frequency band.

Tenth Preferred Embodiment

A switch circuit 3c according to a tenth preferred embodiment of the present invention will be described below with reference to FIG. 14.

Figure 14:
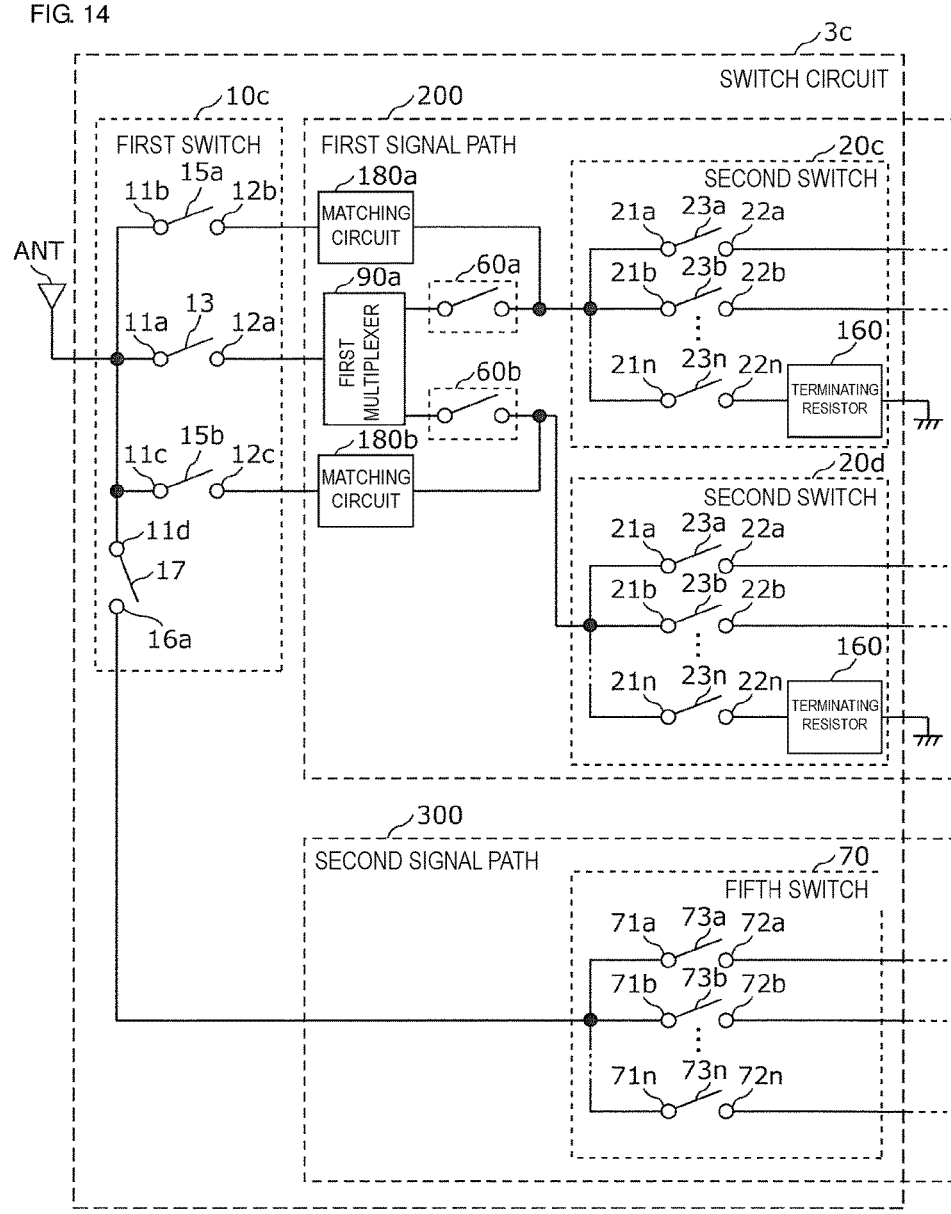
FIG. 14 is a schematic diagram illustrating an example of a switch circuit according to a tenth preferred embodiment of the present invention.

FIG. 14 is a schematic diagram illustrating an example of the switch circuit 3c according to the tenth preferred embodiment.

The switch circuit 3c according to the tenth preferred embodiment is different from the switch circuit 3b according to the ninth preferred embodiment in that it includes a first switch 10c instead of the first switch 10b and also includes a fifth switch 70. The configurations of the other components are similar to those of the ninth preferred embodiment, and an explanation thereof will thus be omitted. The first switch 10c includes at least three first selection terminals. Among the at least three first selection terminals, at least one selection terminal other than first selection terminals 12a and 12b (and a first selection terminal 12c in the tenth preferred embodiment) is at least one sending first selection terminal (sending first selection terminal 16a, in the tenth preferred embodiment). The first switch 10c includes a first common terminal 11d and a switch 17. The configurations of the other components of the first switch 10c are similar to those of the first switch 10b of the ninth preferred embodiment, and an explanation thereof will thus be omitted. In the tenth preferred embodiment, the first common terminals 11a through 11d are collectively called the first common terminal 11.

The sending first selection terminal 16a is connected to a second signal path 300, which is a path different from the first signal path 200. Turning ON the switch 17 connects the first common terminal 11d and the sending first selection terminal 16a. When the switch 17 is ON, the switches 13 and 15 are OFF. When one of the switches 13 and 15 is ON, the switch 17 is OFF. However, both of the switches 17 and 13 or both of the switches 17 and 15 may be ON during a certain period.

The switch 17 is a semiconductor switch such as a diode switch or an FET switch, and is turned ON or OFF in accordance with a control signal from an external source (RF signal processing circuit, for example) outside the first switch 10c. The first common terminals 11a through 11d may be one integrated terminal. In this case, instead of the switches 13, 15, and 17, the first switch 10c includes a switch that changes the connection between the integrated first common terminal 11 and one of the first selection terminals 12a through 12c and the sending first selection terminal 16a. However, the first common terminal 11 may still be able to simultaneously connect to one of the first selection terminals 12a through 12c and to the sending first selection terminal 16a.

The fifth switch 70 includes a fifth common terminal 71 connected to the sending first selection terminal 16a and also includes at least two fifth selection terminals 72. In this case, the fifth common terminal 71 may be directly connected to the sending first selection terminal 16a or may be indirectly connected to the sending first selection terminal 16a via another circuit. The fifth switch 70 also includes a switch 73. Turning ON the switch 73 connects the fifth common terminal 71 and the fifth selection terminal 72. In the tenth preferred embodiment, the fifth switch 70 includes n fifth common terminals, that is, fifth common terminals 71a, 71b, ..., and 71n, which are collectively called the fifth common terminal 71. The fifth switch 70 also includes n fifth selection terminals, that is, fifth selection terminals 72a, 72b, ..., and 72n, which are collectively called the fifth selection terminal 72. In the tenth preferred embodiment, the fifth switch 70 includes n switches, that is, switches 73a, 73b, . . . , and 73n, which are collectively called the switch 73. Turning ON the switch 73n, for example, connects the fifth common terminal 71n and the fifth selection terminal 72n. The switch 73 is a semiconductor switch such as a diode switch or an FET switch, and is turned ON or OFF in accordance with a control signal from an external source (RF signal processing circuit, for example) outside the fifth switch 70. The fifth common terminals 71a, 71b, . . . , and 71n may be one integrated terminal. In this case, instead of the switches 73a, 73b, . . . , and 73n, the fifth switch includes a switch that selects the connection between the integrated fifth common terminal 71 and the fifth selection terminals 72a, 72b, and . . . , and 72n. However, the fifth common terminal 71 may still be able to simultaneously connect to the fifth common terminal 71 and to two or more of the fifth selection terminals 72a, 72b, . . . , and 72n.

The fifth switch 70 is disposed on the second signal path 300. This means that the fifth switch 70 is disposed on a path connected to the sending first selection terminal 16a of the first switch 10c. For example, when the fifth common terminal 71n and the fifth selection terminal 72n are connected to each other, a signal passes through a path connecting the sending first selection terminal 16a, the fifth common terminal 71n, and the fifth selection terminal 72n as the second signal path 300.

A signal to be sent from the antenna ANT is transmitted to the second signal path 300 when the first common terminal 11d and the sending first selection terminal 16a are connected to each other. That is, the second signal path 300 is a path that transmits a sending signal to be sent from the antenna ANT. A sending filter (filter including an elastic wave resonator or an LC circuit) or an amplifier circuit, such as a power amplifier (PA), is connected to the fifth selection terminal 72 of the fifth switch 70. Filters having different pass bands from each other are connected to the fifth selection terminals 72a, 72b, . . . , and 72n, so that multiple sending signals of different frequency bands are able to be simultaneously sent via the fifth switch 70. That is, among multiple sending signals of different frequency bands, one or more sending signals selected by the fifth switch 70 can be sent from the antenna ANT. As described above, the first switch 10c includes at least one sending first selection terminal. When the first common terminal 11d and the sending first selection terminal 16a are connected to each other, a sending signal transmitted to the second signal path 300 can be sent to the antenna ANT. That is, the antenna ANT is also able to be used as a transmit antenna.

As shown in FIG. 14, the first signal path 200 and the second signal path 300 are different paths. The path connecting the first signal path 200 and the antenna ANT and the path connecting the second signal path 300 and the antenna ANT branch off from the antenna ANT at a position closer to the antenna ANT than to the switches 13, 15, and 17 of the first switch 10c. Accordingly, the switches 13 and 15 are not disposed on the path connecting the second signal path 300 and the antenna ANT. It is thus less likely that loss caused by the switches 13 and 15 will occur in a sending signal transmitted to the second signal path 300. As stated above, the first signal path 200 and the second signal path 300 are different paths. This means that a path connected to the second selection terminal 22 (the path of the second switch 20c or 20d opposite the path close to the antenna ANT) and a path connected to the fifth selection terminal 72 (the path of the fifth switch 70 opposite the path close to the antenna ANT) are not integrated together by a circuit, such as a switch circuit in a subsequent stage. To put it another way, if the path connected to the second selection terminal 22 and the path connected to the fifth selection terminal 72 are integrated together by a switch that selects one of multiple inputs and outputting the selected input in a subsequent stage, the first signal path 200 and the second signal path 300 are not different paths. If the path connected to the second selection terminal 22 and the path connected to the fifth selection terminal 72 are each connected to a common ground or connected to different terminals of one RF signal processing circuit, the first signal path 200 and the second signal path 300 are different paths.

By using the switch circuit 3c that is able to receive multiple signals of different frequency bands and simultaneously send multiple sending signals of different frequency bands, the antenna ANT is able to be used as a transmit-and-receive antenna.

In this case, even when the first common terminal 11 and the first selection terminals 12a through 12c are not connected to each other, a high-power sending signal transmitted to the second signal path 300 may leak to the second switch 20c or 20d. However, the terminating resistor 160 is connected to one of the at least two second selection terminals 22 of each of the second switches 20c and 20d. When the antenna ANT is used as a transmit antenna, by connecting the second common terminal 21 and the second selection terminal 22 to which the terminating resistor 160 is connected, energy of a high-power sending signal is able to be output to a ground by the terminating resistor 160. It is thus less likely that circuits, such as filters or LNAs, connected to the second switches 20c and 20d will be broken or the performance will be decreased.

Eleventh Preferred Embodiment

A switch circuit 3d according to an eleventh preferred embodiment of the present invention will be described below with reference to FIG. 15.

Figure 15:
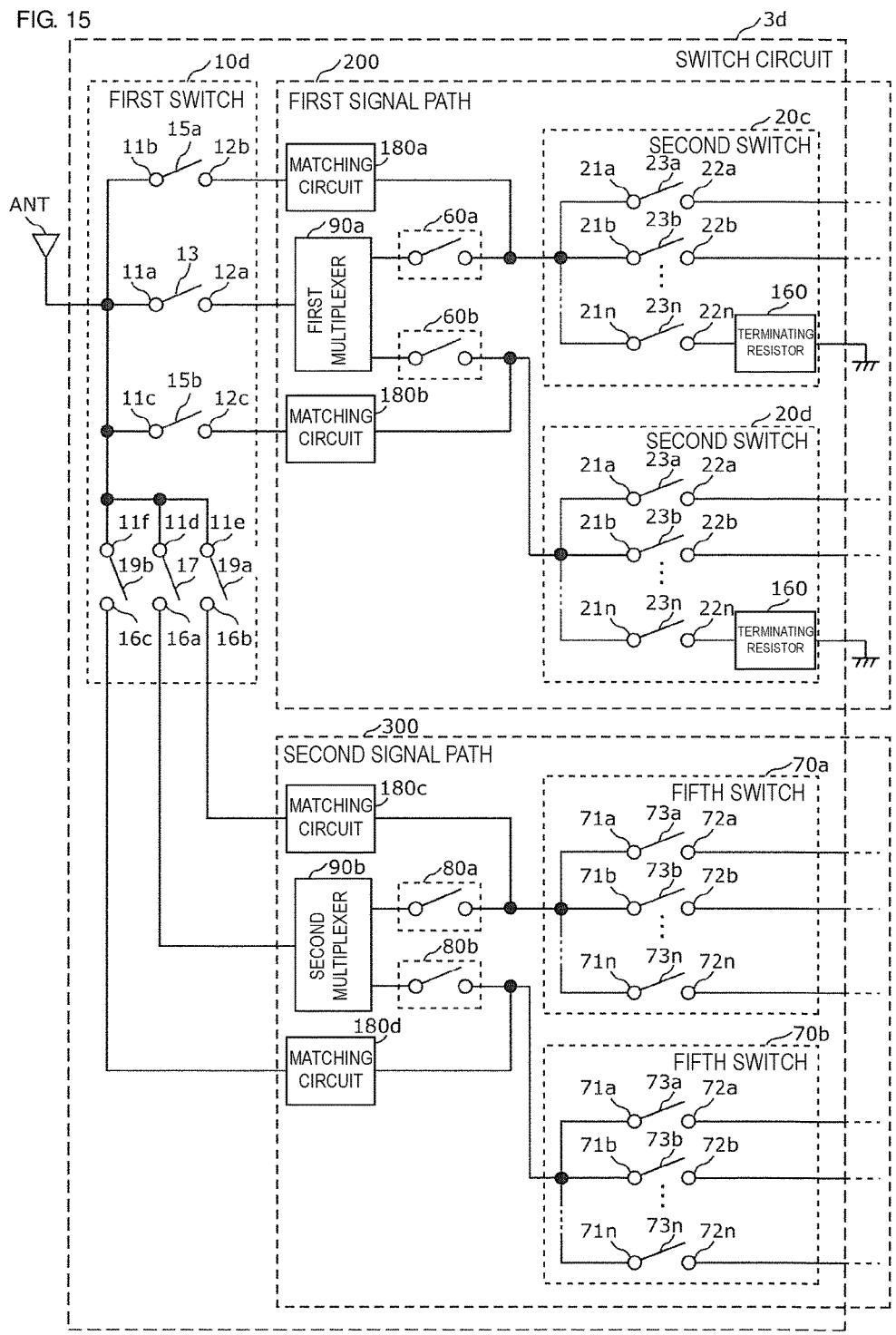
FIG. 15 is a schematic diagram illustrating an example of a switch circuit according to an eleventh preferred embodiment of the present invention.

FIG. 15 is a schematic diagram illustrating an example of the switch circuit 3d according to the eleventh preferred embodiment.

The switch circuit 3d according to the eleventh preferred embodiment is different from the switch circuit 3c according to the tenth preferred embodiment in that it includes a first switch 10d instead of the first switch 10c and also includes two or more fifth switches 70, a second multiplexer 90b, matching circuits 180c and 180d, and sixth switches 80a and 80b. The first switch 10d and the second signal path 300 are connected to each other via multiple paths. The configurations of the other components are similar to those of the tenth preferred embodiment, and an explanation thereof will thus be omitted. In the eleventh preferred embodiment, the first and second multiplexers 90a and 90b are collectively called the multiplexer 90, and the matching circuits 180a through 180d are collectively called the matching circuit 180. The switch circuit 3d includes fifth switches 70a and 70b, which are collectively called the fifth switch 70.

The second multiplexer 90b may include filters each including an elastic wave resonator, an LC circuit, or both of them. The elastic wave resonator may be a SAW resonator or a BAW resonator. The SAW resonator includes a substrate and IDT electrodes. The substrate preferably has piezoelectricity at least on its surface. For example, the substrate may include a piezoelectric thin film on its surface, and may be a multilayer body including the piezoelectric thin film and another film having different acoustic velocities, and a support substrate. Alternatively, the entirety of the substrate may have piezoelectricity. In this case, the substrate is a piezoelectric substrate defined by a single piezoelectric layer.

The filters of the second multiplexer 90b may be band pass filters. Other examples of the filters are a high pass filter, a low pass filter, and a band elimination filter.

The first switch 10d includes a first common terminal 11 connected to the antenna ANT, first selection terminals 12a through 12c connected to the first signal path 200, and at least two sending first selection terminals (sending first selection terminals 16a through 16c in the eleventh preferred embodiment) connected to the second signal path 300. The first switch 10d includes switches 13, 15, 17, and 19. In the eleventh preferred embodiment, the first switch 10d includes first common terminals 11a through 11f, which are collectively called the first common terminal 11. The first switch 10d also includes sending first selection terminals 16a through 16c, which are collectively called the sending first selection terminal 16. The first switch 10d also includes switches 19a and 19b, which are collectively called the switch 19.

The sixth switch 80a is connected between the second multiplexer 90b and the fifth common terminal 71 of the fifth switch 70a. More specifically, as shown in FIG. 15, the switch circuit 3d includes the sixth switch 80a at a position closer to the second multiplexer 90b than to a node between a path connected to the sending first selection terminal 16a and a path connecting the second multiplexer 90b and the fifth switch 70a. Similarly, the switch circuit 3d includes the sixth switch 80b between the second multiplexer 90b and the fifth switch 70b. In the eleventh preferred embodiment, the sixth switches 80a and 80b are collectively called the sixth switch 80.

By turning ON the switch 13 and the fourth switches 60a and 60b, a signal received by the antenna ANT is transmitted to the first signal path 200 via the first multiplexer 90a. By turning ON the switch 17 and the sixth switches 80a and 80b, a signal transmitted to the second signal path 300 is sent to the antenna ANT via the second multiplexer 90b. When the first common terminal 11b and the first selection terminal 12b are connected to each other by turning ON the switch 15a and when the fourth switch 60a is OFF, a signal received by the antenna ANT is transmitted to the first signal path 200 without passing through the first multiplexer 90a. When the first common terminal 11c and the first selection terminal 12c are connected to each other by turning ON the switch 15b and when the fourth switch 60b is OFF, a signal received by the antenna ANT is transmitted to the first signal path 200 without passing through the first multiplexer 90a. When the first common terminal 11e and the sending first selection terminal 16b are connected to each other by turning ON the switch 19a and when the sixth switch 80a is OFF, a signal transmitted to the second signal path 300 is sent to the antenna ANT without passing through the second multiplexer 90b. When the first common terminal 11f and the sending first selection terminal 16c are connected to each other by turning ON the switch 19b and when the sixth switch 80b is OFF, a signal transmitted to the second signal path 300 is sent to the antenna ANT without passing through the second multiplexer 90b.

When the switch 13 is ON, the switches 15a, 15b, 17, 19a, and 19b are OFF. When at least one of the switches 15a and 15b is ON, the switches 13, 17, 19a, and 19b are OFF. When the switch 17 is ON, the switches 13, 15a, 15b, 19a, and 19b are OFF. When at least one of the switches 19a and 19b is ON, the switches 13, 15a, 15b, and 17 are OFF. When one of the switches 13, 15a, and 15b is ON, one of the switches 17, 19a, and 19b may be ON. Similarly, when one of the switches 17, 19a, and 19b is ON, one of the switches 13, 15a, and 15b may be ON.

The second multiplexer 90b is connected between the sending first selection terminal 16a and the fifth common terminal 71 of each of the at least two fifth switches 70. By using the second multiplexer 90b, the switch circuit 3d is able to simultaneously send multiple sending signals of different frequency bands, thus making it possible to achieve CA communication to send signals. However, when a sending signal passes through the second multiplexer 90b, signal loss (insertion loss) occurs because of the second multiplexer 90b. For example, in the CA-support circuit 400 shown in FIG. 18, a signal to be sent from the antenna 410 passes through the multiplexer 420. Even when a signal is sent or received in a non-CA mode, it passes through the multiplexer 420, thus causing the occurrence of insertion loss.

To address this issue, in the eleventh preferred embodiment, when the first common terminal 11 and a sending first selection terminal (sending first selection terminal 16b or 16c in the eleventh preferred embodiment) other than the sending first selection terminal 16a are connected to each other and when the sixth switch 80 is OFF, a signal to be sent from the antenna ANT is transmitted to the second signal path 300 without passing through the second multiplexer 90b. This makes it possible to send a sending signal transmitted to the second signal path 300 to the antenna ANT without passing through the second multiplexer 90b. As a result, when CA communication is not performed, insertion loss which may occur in a sending signal is reduced.

The matching circuit 180c is connected between the sending first selection terminal 16b of the first switch 10d and the fifth common terminal 71 of the fifth switch 70a. The matching circuit 180d is connected between the sending first selection terminal 16c of the first switch 10d and the fifth common terminal 71 of the fifth switch 70b. A matching circuit 180 may be connected between the sending first selection terminal 16a and the fifth common terminal 71, though it is not shown. The second multiplexer 90b may perform the function of a matching circuit 180. The second multiplexer 90b and a matching circuit 180 may be provided integrally. The matching circuit 180 is able to perform impedance matching between the first switch 10d and the fifth switch 70, thus decreasing the level of loss (return loss) which may occur in a signal transmitted to the second signal path 300.

As described above, filters having different pass bands from each other are connected to the at least two fifth selection terminals 72 of the fifth switch 70. That is, the frequency band for which the matching circuit 180 performs impedance matching differs depending on which switch 73 will be turned ON. The matching circuit 180 predicts which switch 73 in the fifth switch 70 will be turned ON and adjusts itself in advance to the frequency band of a signal to be subjected to impedance matching. If the parameter used to perform impedance matching in the matching circuit 180 is variable, a control signal used to turn ON or OFF the switch 73 received by the second switch 70 is also received by the matching circuit 180 (matching circuits 180c and 180d). That is, the matching circuit 180 is able to identify the switch 73 to be turned ON in the second switch 70, that is, the matching circuit 180 is able to identify the frequency band to be subjected to impedance matching. The matching circuit 180 includes plural circuits having different parameters, such as the value of an inductor or a capacitor, or having different connection modes. In each of these circuits, the parameter, such as the value of an inductor or a capacitor, or the connection mode has been adjusted so that impedance matching is able to be performed according to the associated frequency band. The matching circuit 180 includes a switch that is able to select one of these circuits to be connected between the first switch 10d and the fifth switch 70 in accordance with a control signal received by the matching circuit 180. This configuration enables the matching circuit 180 to perform impedance matching for the frequency band associated with the switch 73 to be turned ON in the fifth switch 70.

As described above, the impedance matching parameter or the connection mode of the matching circuit 180 is adjusted in advance to the frequency band to be subjected to impedance matching, or is changed in accordance with a control signal for turning ON or OFF the switch 73 received by the fifth switch 70. It is thus possible to achieve significantly improved or optimal impedance matching according to the frequency band.

Twelfth Preferred Embodiment

A switch circuit and a radio-frequency module according to a preferred embodiment of the present invention is applicable to a communication device. In a twelfth preferred embodiment of the present invention, a communication device 4 including a switch circuit (radio-frequency module) will be described.

Figure 16:
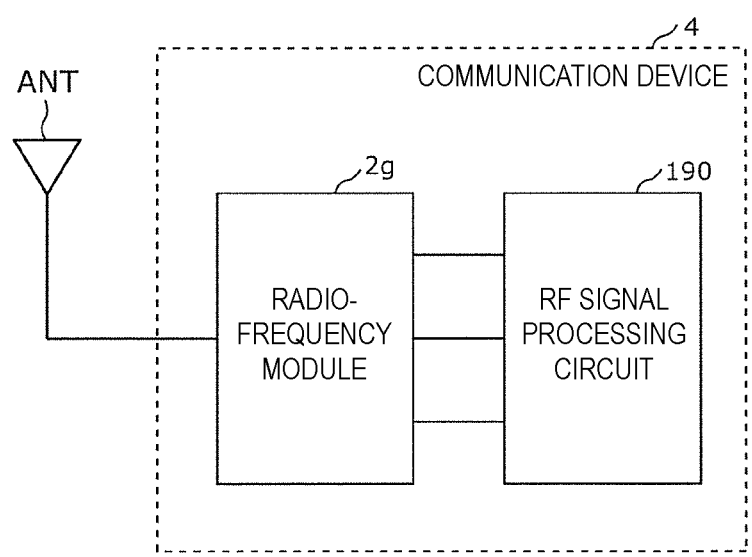
FIG. 16 is a schematic diagram illustrating an example of a communication device according to a twelfth preferred embodiment of the present invention.

FIG. 16 is a schematic diagram illustrating an example of the communication device 4 according to the twelfth preferred embodiment.

The communication device 4 includes the radio-frequency module 2g according to the sixth preferred embodiment and an RF signal processing circuit (RFIC) 190. The communication device 4 may include any one of the radio-frequency modules 2a through 2f according to the second through fifth preferred embodiments instead of the radio-frequency module 2g.

The radio-frequency module 2g transmits an RF signal received by the antenna ANT and an RF signal to be sent by the antenna ANT between the antenna ANT and the RF signal processing circuit 190.

The RF signal processing circuit 190 is a circuit that processes the RF signal. The RF signal processing circuit 190 performs signal processing, such as down-conversion, on a received signal input from the antenna ANT and outputs the resulting received signal to a baseband signal processing circuit (not shown). The RF signal processing circuit 190 also performs signal processing, such as up-conversion, on a sending signal input from the baseband signal processing circuit and outputs the resulting sending signal to the antenna ANT.

A communication device 5 including a switch circuit (radio-frequency module) will be described below as a modified example of the twelfth preferred embodiment.

Figure 17:
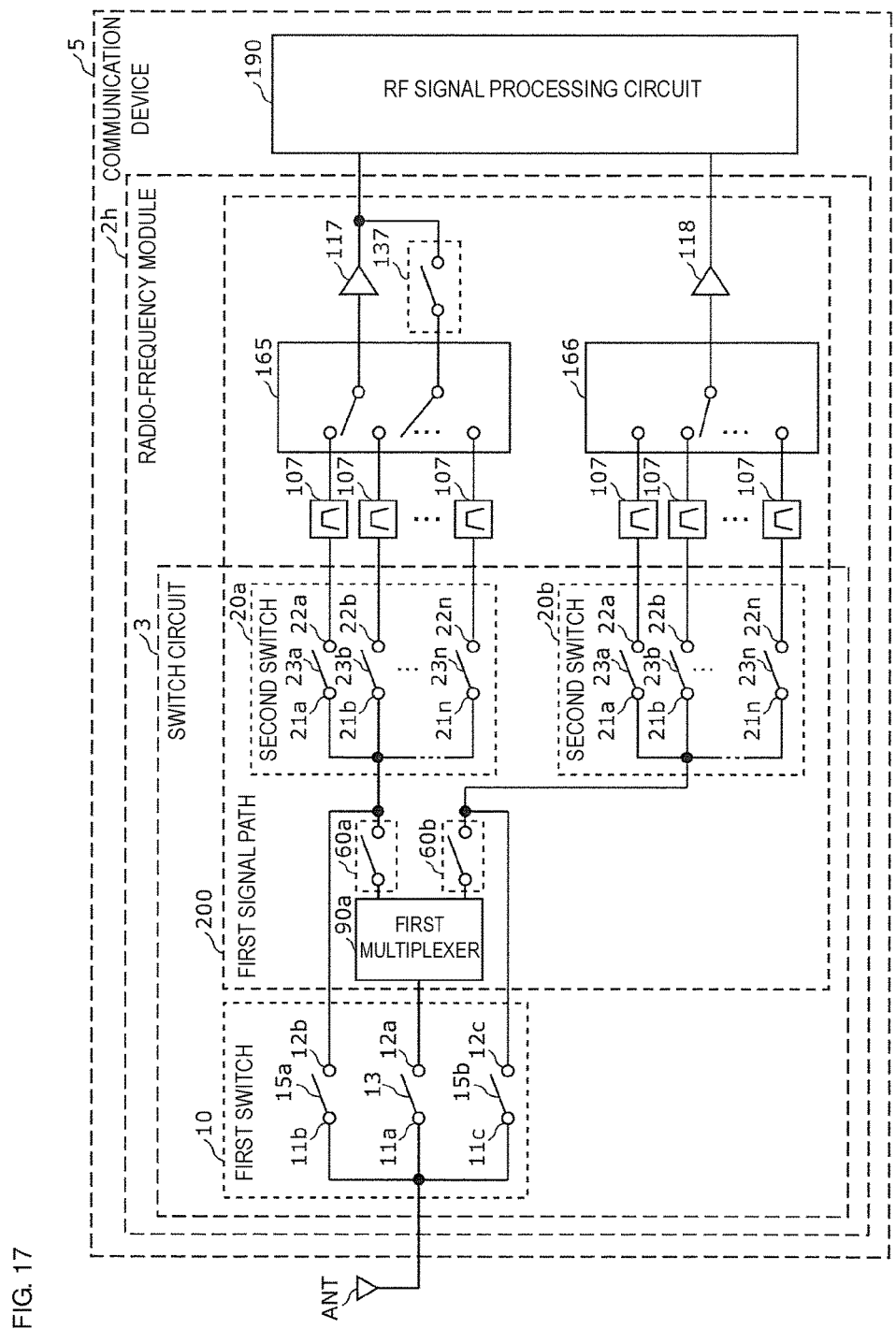
FIG. 17 is a schematic diagram illustrating an example of a communication device according to a modified example of the twelfth preferred embodiment of the present invention.

FIG. 17 is a schematic diagram illustrating an example of the communication device 5 according to the modified example of the twelfth preferred embodiment.

The communication device 5 includes a radio-frequency module 2h and an RF signal processing circuit 190.

The radio-frequency module 2h sends and receives RF signals between the antenna ANT and the RF signal processing circuit 190. In this example, the radio-frequency module 2h receives RF received signals. The radio-frequency module 2h includes the switch circuit 3 according to the seventh preferred embodiment, plural filters 107 connected to the at least two second selection terminals 22 of the second switch 20, and amplifier circuits 117 and 118 connected to the plural filters 107. The radio-frequency module 2h also includes switches 165 and 166. The amplifier circuit 117 is connected to the filters 107 via the switch 165, while the amplifier circuit 118 is connected to the filters 107 via the switch 166. The radio-frequency module 2h also includes a bypass switch 137 on a bypass path bypassing the amplifier circuit 117. The bypass switch 137 is connected to a terminal of the switch 165 on the side closer to the RF signal processing circuit 190. The switch circuit 3 is similar to that of the seventh preferred embodiment, and an explanation thereof will thus be omitted.

The filters 107 are filters including elastic wave resonators or LC circuits. The filters 107 may be band pass filters. Other examples of the filters 107 are a high pass filter, a low pass filter, and a band elimination filter. The filters 107 have different pass bands from each other. The filters 107 are connected to the second selection terminal 22, so that the switch circuit 3 is able to receive signals of different frequency bands. The pass bands of the filters 107 are in a range of about 700 MHz to about 3.5 GHz, for example.

The switches 165 and 166 include plural selection terminals connected to the filters 107, common terminals connected to the amplifier circuits 117 and 118, and a common terminal connected to the bypass switch 137. The switches 165 and 166 each select one of the common terminals and one of the selection terminals in accordance with a control signal output from the RF signal processing circuit 190, for example. The switch 165 selects the selection terminal connected to the filter 107 associated with a desired frequency band and the common terminal connected to the amplifier circuit 117 or the bypass switch 137. The switch 166 selects the selection terminal connected to the filter 107 associated with a desired frequency band and the common terminal connected to the amplifier circuit 118.

The amplifier circuits 117 and 118 are LNAs that amplify RF received signals and output them to the RF signal processing circuit 190.

The bypass switch 137 is turned ON when amplifying of an RF received signal is not necessary. When the bypass switch 137 is ON, the selection terminal connected to the filter 107 is connected to the common terminal connected to the bypass switch 137 instead of that connected to the amplifier circuit 117.

The RF signal processing circuit 190 is a circuit that processes an RF signal received by the antenna ANT. The RF signal processing circuit 190 performs signal processing, such as down-conversion, on an RF received signal input from the antenna ANT via the first signal path 200 and outputs the resulting received signal to a baseband signal processing circuit (not shown). The radio-frequency module 2h may include one of the switch circuits 3a through 3d instead of the switch circuit 3. If the radio-frequency module 2h includes the switch circuit 3c or 3d, the RF signal processing circuit 190 also processes an RF sending signal to be sent from the antenna ANT. In this case, the RF signal processing circuit 190 performs signal processing, such as up-conversion, on an RF sending signal input from the baseband signal processing circuit and outputs the resulting sending signal to the antenna ANT via the second signal path 300.

As described above, the switch circuit or the radio-frequency module according to a preferred embodiment of the present invention may be applied to a communication device.

Other Preferred Embodiments

The switch circuits, radio-frequency modules, and communication devices according to the preferred embodiments have been discussed. However, the present invention is not restricted to the above-described preferred embodiments.

In the above-described preferred embodiments, the switch circuit includes at least one of the first and second multiplexers 90a and 90b. However, the switch circuit may not necessarily include the first multiplexer 90a or the second multiplexer 90b. That is, the first and second multiplexers 90a and 90b may be provided separately from the switch circuit. In this case, the radio-frequency module may include the switch circuit and at least one of the first and second multiplexers 90a and 90b.

In the above-described preferred embodiments, the first switch 10 through the third switch 50 are n-pole n-throw (nPnT) (n≥1) switches. However, the first switch 10 through the third switch 50 may be another type of switch. For example, the first switch 10 through the third switch 50 may be formed as a combination of SPST switches, as in the first switch 10bConcerning at least two or more of such SPST switches, the terminal at one end of each SPST switch may be integrated with the terminals at the same end of the other SPST switches.

Although in the first through seventh preferred embodiments, the second switch 20 does not include a terminating resistor 160, it may include a terminating resistor 160. That is, in the first through seventh preferred embodiments, the terminating resistor 160 may be connected to at least one of the second selection terminals.

Although in the first through eighth preferred embodiments, a matching circuit 180 is not disposed between the first switch 10 and the second switch 20, a matching circuit 180 may be disposed therebetween. That is, in the first through eighth preferred embodiments, matching circuits 180 may be disposed between the at least two first selection terminals of the first switch 10 and the at least one second common terminal of the second switch 20.

In the eighth through eleventh preferred embodiments, the terminating resistors 160 are built in the second switches 20c and 20d and are connected to the second selection terminals 22. However, the terminating resistors 160 may be disposed outside the second switches 20c and 20d and be connected to the second selection terminals 22.

In the eighth through eleventh preferred embodiments, the switch circuit includes the second switches 20c and 20d each including the terminating resistor 160. However, the switch circuit may include the second switch 20 without a terminating resistor 160, such as those in the first through seventh preferred embodiments.

In the ninth preferred embodiment, the matching circuit 180 is connected between the first selection terminal 12b and the second common terminal 21 of the second switch 20c and between the first selection terminal 12c and the second common terminal 21 of the second switch 20d. Alternatively, the matching circuit 180 may be connected only one of between the first selection terminal 12b and the second common terminal 21 of the second switch 20c and between the first selection terminal 12c and the second common terminal 21 of the second switch 20d.

In the tenth preferred embodiment, the matching circuit 180 is connected between the first selection terminal 12b and the second common terminal 21 of the second switch 20c and between the first selection terminal 12c and the second common terminal 21 of the second switch 20d. Alternatively, the matching circuit 180 may be connected neither between the first selection terminal 12b and the second common terminal 21 of the second switch 20c nor between the first selection terminal 12c and the second common terminal 21 of the second switch 20d.

Although in the tenth preferred embodiment the matching circuit 180 is not connected between the sending first selection terminal 16a and the fifth common terminal 71, the matching circuit 180 may be connected therebetween.

In the eleventh preferred embodiment, the matching circuit 180 is connected all of between the first selection terminal 12b and the second common terminal 21 of the second switch 20c, between the first selection terminal 12c and the second common terminal 21 of the second switch 20d, between the sending first selection terminal 16b and the fifth common terminal 71 of the fifth switch 70a, and between the sending first selection terminal 16c and the fifth common terminal 71 of the fifth switch 70b. However, the matching circuit 180 may be connected one of between the first selection terminal 12b and the second common terminal 21 of the second switch 20c, between the first selection terminal 12c and the second common terminal 21 of the second switch 20d, between the sending first selection terminal 16b and the fifth common terminal 71 of the fifth switch 70a, and between the sending first selection terminal 16c and the fifth common terminal 71 of the fifth switch 70b.

Although in the seventh through tenth preferred embodiments, the switch circuit includes two second switches, it may include three or more second switches.

Although in the eleventh preferred embodiment, the switch circuit 3d includes two second switches 20c and 20d and two fifth switches 70a and 70b, it may include three or more second switches 20 and three or more fifth switches 70.

Preferred embodiments obtained by making various modifications to the above-described preferred embodiments by those skilled in the art and preferred embodiments achieved by combining the elements and functions of the above-described preferred embodiments without departing from the scope and spirit of the invention are also encompassed in the present invention.

Preferred embodiments of the present invention are widely applicable in communication devices, such as cellular phones, as switch circuits, radio-frequency modules, and communication devices that are able to support CA communication and also to reduce insertion loss caused by a multiplexer when CA communication is not performed.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A switch circuit comprising:
   a first switch including a first common terminal and at least two first selection terminals selectively connected to the first common terminal; and
   a second switch including at least one second common terminal and at least one second selection terminal selectively connected to the at least one second common terminal; wherein
   one of the at least two first selection terminals and the at least one second common terminal are connected to each other via a path passing through a first multiplexer, the first multiplexer being a filter that separates at the same time one signal into a plurality of signals of different frequency bands or integrates at the same time a plurality of signals of different frequency bands into one signal; and
   another one of the at least two first selection terminals and the at least one second common terminal are connected to each other via a bypass path bypassing the first multiplexer.

2. The switch circuit according to claim 1, wherein the at least one second selection terminal includes a second selection terminal connected to a terminating resistor.

3. The switch circuit according to claim 1, wherein a matching circuit is disposed between the at least two first selection terminals and the at least one second common terminal.

4. The switch circuit according to claim 1, wherein
the second switch includes at least two second common terminals defining the at least one second common terminal;
the first selection terminal connected to the path passing through the first multiplexer is connected to one of the at least two second common terminals via the path passing through the first multiplexer; and
the first selection terminal connected to the bypass path bypassing the first multiplexer is connected to another one of the at least two second common terminals via the bypass path.

5. The switch circuit according to claim 4, wherein
a path passing through a filter and a bypass path bypassing the filter are connected to the at least one second selection terminal; and
the path passing through the filter and the bypass path bypassing the filter are connected to different second selection terminals of the at least one second selection terminal.

6. The switch circuit according to claim 4, wherein
a path passing through an amplifier circuit and a bypass path bypassing the amplifier circuit are directly or indirectly connected to the at least one second selection terminal; and
the path passing through the amplifier circuit and the bypass path bypassing the amplifier circuit are connected to different second selection terminals of the at least one second selection terminal.

7. The switch circuit according to claim 4, wherein
a branching path that branches into a path passing through an amplifier circuit and a bypass path bypassing the amplifier circuit is directly or indirectly connected to the at least one second selection terminal; and
a bypass switch is disposed on the bypass path bypassing the amplifier circuit to selectively pass or block a signal flowing through the bypass path.

8. The switch circuit according to claim 4, further comprising:
a third switch including at least two third selection terminals and at least one third common terminal selectively connected to the at least two third selection terminals; wherein
a branching path that branches into a path passing through an amplifier circuit and a bypass path bypassing the amplifier circuit is connected to the first multiplexer;
the path passing through the amplifier circuit is connected to one of the at least two third selection terminals;
the bypass path bypassing the amplifier circuit is connected to another one of the at least two third selection terminals; and
a bypass switch is disposed on the bypass path bypassing the amplifier circuit to selectively pass or block a signal flowing through the bypass path.

9. The switch circuit according to claim 7, wherein a matching circuit is disposed before a branching point of the branching path.

10. The switch circuit according to claim 7, wherein a matching circuit is disposed between a branching point of the branching path and the amplifier circuit.

11. The switch circuit according to claim 4, wherein
the first switch includes at least three first selection terminals defining the at least two first selection terminals; and
among the at least three first selection terminals, a first selection terminal other than the first selection terminal connected to the path passing through the first multiplexer and the first selection terminal connected to the bypass path bypassing the first multiplexer is a sending first selection terminal.

12. The switch circuit according to claim 1, wherein
the switch circuit includes two or more second switches defining the second switch;
the first common terminal is connected to an antenna;
the at least two first selection terminals are each connected to a first signal path;
the two or more second switches are disposed in the first signal path and each include one second common terminal defining the at least one second common terminal;
the first selection terminal connected to the path passing through the first multiplexer is connected to the second common terminal via the path passing through the first multiplexer;
the first selection terminal connected to the bypass path bypassing the first multiplexer is connected to the second common terminal via the bypass path;
a fourth switch is disposed between the first multiplexer and the second common terminal; and
a signal received by the antenna is transmitted to the first signal path via the first multiplexer when the first common terminal and the first selection terminal connected to the path passing through the first multiplexer are connected to each other and when the fourth switch is ON, and a signal received by the antenna is transmitted to the first signal path without passing through the first multiplexer when the first common terminal and the first selection terminal connected to the bypass path bypassing the first multiplexer are connected to each other and when the fourth switch is OFF.

13. The switch circuit according to claim 12, wherein
the first switch includes at least three first selection terminals defining the at least two first selection terminals;
among the at least three first selection terminals, at least one first selection terminal other than the first selection terminal connected to the path passing through the first multiplexer and the first selection terminal connected to the bypass path bypassing the first multiplexer is at least one sending first selection terminal;
the at least one sending first selection terminal is connected to a second signal path, the second signal path being a path different from the first signal path; and
a signal to be sent from the antenna is transmitted to the second signal path when the first common terminal and the at least one sending first selection terminal are connected to each other.

14. The switch circuit according to claim 13, further comprising:
a fifth switch that is disposed in the second signal path and that includes a fifth common terminal connected to the at least one sending first selection terminal and includes at least two fifth selection terminals.

15. The switch circuit according to claim 14, wherein a matching circuit is disposed between the at least one sending first selection terminal and the fifth common terminal.

16. The switch circuit according to claim 14, wherein
the switch circuit includes two or more fifth switches defining the fifth switch; and
a second multiplexer is connected between one of the at least one sending first selection terminal and the fifth common terminal of each of the two or more fifth switches.

17. The switch circuit according to claim 16, wherein
the first switch includes at least two sending first selection terminals defining the at least one sending first selection terminal;
a sixth switch is connected between the second multiplexer and the fifth common terminal; and
a signal to be sent from the antenna is transmitted to the second signal path without passing through the second multiplexer when the first common terminal and another one of the at least two sending first selection terminals are connected to each other and when the sixth switch is OFF.

18. A radio-frequency module comprising:
the switch circuit according to claim 1;
a filter connected to the at least one second selection terminal; and
an amplifier circuit connected to the filter.

19. A communication device comprising:
a radio-frequency signal processing circuit that processes a radio-frequency signal sent or received by an antenna; and
the radio-frequency module according to claim 18 that transmits the radio-frequency signal between the antenna and the radio-frequency signal processing circuit.

* * * * *